(12) United States Patent
Hebrink et al.

(10) Patent No.: US 9,523,516 B2
(45) Date of Patent: Dec. 20, 2016

(54) BROADBAND REFLECTORS, CONCENTRATED SOLAR POWER SYSTEMS, AND METHODS OF USING THE SAME

(75) Inventors: Timothy J. Hebrink, Scandia, MN (US); Susannah C. Clear, Hastings, MN (US); Laurence R. Gilbert, Marine on St. Croix, MN (US); Michael F. Weber, Shoreview, MN (US); Ta-Hua Yu, Woodbury, MN (US); Daniel Ting-Yuan Chen, St. Paul, MN (US); Audrey A. Sherman, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1062 days.

(21) Appl. No.: 13/142,910

(22) PCT Filed: Dec. 21, 2009

(86) PCT No.: PCT/US2009/068944
§ 371 (c)(1),
(2), (4) Date: Oct. 3, 2011

(87) PCT Pub. No.: WO2010/078105
PCT Pub. Date: Jul. 8, 2010

(65) Prior Publication Data
US 2012/0011850 A1 Jan. 19, 2012

Related U.S. Application Data

(60) Provisional application No. 61/141,338, filed on Dec. 30, 2008, provisional application No. 61/178,123, filed on May 14, 2009.

(51) Int. Cl.
B32B 7/02 (2006.01)
B32B 15/08 (2006.01)
(Continued)

(52) U.S. Cl.
CPC ............... *F24J 2/1057* (2013.01); *F24J 2/07* (2013.01); *F24J 2/14* (2013.01); *F24J 2/16* (2013.01);
(Continued)

(58) Field of Classification Search
None
See application file for complete search history.

(56) References Cited

U.S. PATENT DOCUMENTS 3,076,861 A 2/1963 Samulon
3,247,392 A 4/1966 Thelen
(Continued)

FOREIGN PATENT DOCUMENTS

CN 1624029 6/2005
CN 101233434 7/2006
(Continued)

OTHER PUBLICATIONS

Kennedy, "Provide status of test results of candidate solar mirror samples and identify promising candidates," CSP FY 2005 Milestone Report, Sep. 30, 2005, 20 pages.
(Continued)

*Primary Examiner* — Vivian Chen

(57) ABSTRACT

Broadband reflectors include a UV-reflective multilayer optical film and a VIS/IR-reflective layer. In various embodiments, the VIS/IR reflective layer may be a reflective metal layer or a multilayer optical film. Concentrated solar power systems and methods of harnessing solar energy using the broadband reflectors and optionally comprising a celestial tracking mechanism are also disclosed.

20 Claims, 7 Drawing Sheets

(51) Int. Cl.
| | |
|---|---|
| B32B 15/082 | (2006.01) |
| B32B 15/085 | (2006.01) |
| B32B 15/088 | (2006.01) |
| B32B 15/09 | (2006.01) |
| B32B 15/18 | (2006.01) |
| B32B 15/20 | (2006.01) |
| B32B 27/08 | (2006.01) |
| B32B 27/30 | (2006.01) |
| B32B 27/32 | (2006.01) |
| B32B 27/34 | (2006.01) |
| B32B 27/36 | (2006.01) |
| G02B 1/04 | (2006.01) |
| G02B 1/10 | (2015.01) |
| G02B 5/08 | (2006.01) |
| G02B 6/00 | (2006.01) |
| G02B 17/00 | (2006.01) |
| G02B 19/00 | (2006.01) |
| F03G 6/06 | (2006.01) |
| F24J 2/00 | (2014.01) |
| F24J 2/04 | (2006.01) |
| F24J 2/06 | (2006.01) |
| F24J 2/10 | (2006.01) |
| F24J 2/16 | (2006.01) |
| F24J 2/24 | (2006.01) |
| F24J 2/38 | (2014.01) |
| F24J 2/07 | (2006.01) |
| F24J 2/14 | (2006.01) |
| F24J 2/54 | (2006.01) |
| H01L 31/054 | (2014.01) |
| B32B 7/12 | (2006.01) |
| B32B 27/28 | (2006.01) |
| F21V 8/00 | (2006.01) |
| F24J 2/36 | (2006.01) |
| H01L 31/042 | (2014.01) |

(52) U.S. Cl.
CPC ............ *F24J 2/541* (2013.01); *H01L 31/0547* (2014.12); *B32B 7/02* (2013.01); *B32B 7/12* (2013.01); *B32B 15/08* (2013.01); *B32B 15/082* (2013.01); *B32B 15/085* (2013.01); *B32B 15/088* (2013.01); *B32B 15/09* (2013.01); *B32B 15/18* (2013.01); *B32B 15/20* (2013.01); *B32B 27/283* (2013.01); *B32B 27/302* (2013.01); *B32B 27/304* (2013.01); *B32B 27/306* (2013.01); *B32B 27/308* (2013.01); *B32B 27/325* (2013.01); *B32B 27/34* (2013.01); *B32B 27/36* (2013.01); *B32B 2250/42* (2013.01); *B32B 2255/10* (2013.01); *B32B 2255/205* (2013.01); *B32B 2307/416* (2013.01); *B32B 2311/08* (2013.01); *B32B 2311/12* (2013.01); *B32B 2311/24* (2013.01); *B32B 2311/30* (2013.01); *B32B 2323/00* (2013.01); *B32B 2325/00* (2013.01); *B32B 2327/00* (2013.01); *B32B 2331/00* (2013.01); *B32B 2333/12* (2013.01); *B32B 2367/00* (2013.01); *B32B 2377/00* (2013.01); *B32B 2383/00* (2013.01); *B32B 2551/00* (2013.01); *B32B 2551/08* (2013.01); *F03G 6/06* (2013.01); *F24J 2/00* (2013.01); *F24J 2/04* (2013.01); *F24J 2/06* (2013.01); *F24J 2/10* (2013.01); *F24J 2/24* (2013.01); *F24J 2/36* (2013.01); *F24J 2002/1076* (2013.01); *F24J 2002/5468* (2013.01); *F24J 2002/5486* (2013.01); *G02B 1/04* (2013.01); *G02B 1/10* (2013.01); *G02B 5/085* (2013.01); *G02B 5/0841* (2013.01); *G02B 5/0866* (2013.01); *G02B 5/0891* (2013.01); *G02B 6/0011* (2013.01); *G02B 17/006* (2013.01); *G02B 19/0019* (2013.01); *G02B 19/0042* (2013.01); *H02S 20/00* (2013.01); *Y02E 10/41* (2013.01); *Y02E 10/45* (2013.01); *Y02E 10/46* (2013.01); *Y02E 10/47* (2013.01); *Y02E 10/52* (2013.01); *Y10T 428/24942* (2015.01); *Y10T 428/3154* (2015.04); *Y10T 428/3175* (2015.04); *Y10T 428/31681* (2015.04); *Y10T 428/31692* (2015.04); *Y10T 428/31757* (2015.04); *Y10T 428/31786* (2015.04); *Y10T 428/31909* (2015.04); *Y10T 428/31913* (2015.04); *Y10T 428/31928* (2015.04)

(56) References Cited

U.S. PATENT DOCUMENTS

| | | | |
|---|---|---|---|
| 3,711,176 | A | 1/1973 | Alfrey, Jr. |
| 3,990,914 | A | 11/1976 | Weinstein |
| 4,055,161 | A | 10/1977 | Jones |
| 4,055,948 | A * | 11/1977 | Kraus et al. ................. 60/641.8 |
| 4,096,387 | A | 6/1978 | Buckley |
| 4,143,640 | A * | 3/1979 | Pierce ........................... 126/600 |
| 4,159,710 | A * | 7/1979 | Prast .......................... F24J 2/07 126/579 |
| 4,229,066 | A | 10/1980 | Rancourt |
| 4,230,768 | A | 10/1980 | Hamada |
| 4,268,709 | A | 5/1981 | Boling |
| 4,275,710 | A * | 6/1981 | Stevenson ..................... 126/606 |
| 4,293,732 | A | 10/1981 | Rancourt |
| 4,354,117 | A | 10/1982 | Abernathy |
| 4,414,254 | A * | 11/1983 | Iwata et al. ..................... 428/34 |
| 4,519,384 | A * | 5/1985 | Murtha ........................ 126/635 |
| 4,714,308 | A * | 12/1987 | Sawamura ........... G02B 5/0858 359/360 |
| 4,883,340 | A | 11/1989 | Dominguez |
| 5,103,337 | A | 4/1992 | Schrenk |
| 5,118,540 | A * | 6/1992 | Hutchison ................. B32B 7/02 359/360 |
| 5,122,905 | A | 6/1992 | Wheatley |
| 5,122,906 | A | 6/1992 | Wheatley |
| 5,132,164 | A | 7/1992 | Moriya |
| 5,140,457 | A * | 8/1992 | Letter ....................... F21V 7/22 359/359 |
| 5,233,465 | A | 8/1993 | Wheatley |
| 5,253,105 | A * | 10/1993 | Paul ......................... C03C 17/36 148/277 |
| 5,339,198 | A * | 8/1994 | Wheatly .................... G02B 1/04 359/359 |
| 5,360,659 | A | 11/1994 | Arends |
| 5,389,324 | A | 2/1995 | Lewis |
| 5,449,413 | A | 9/1995 | Beauchamp |
| 5,504,134 | A | 4/1996 | Palmer |
| 5,540,978 | A * | 7/1996 | Schrenk ..................... B32B 7/02 359/586 |
| 5,552,927 | A | 9/1996 | Wheatly |
| 5,699,188 | A * | 12/1997 | Gilbert .................... B32B 27/36 359/489.15 |
| 5,700,332 | A | 12/1997 | Brown |
| 5,835,273 | A * | 11/1998 | Ida ....................... G02B 5/0833 359/584 |
| 5,876,688 | A | 3/1999 | Laundon |
| 5,882,774 | A * | 3/1999 | Jonza et al. ................... 428/212 |
| 5,978,133 | A | 11/1999 | Gillich |
| 5,994,641 | A | 11/1999 | Kardauskas |
| 6,049,419 | A * | 4/2000 | Wheatley et al. ............ 359/359 |
| 6,077,722 | A | 6/2000 | Jansen |
| 6,078,425 | A * | 6/2000 | Wolfe et al. ................. 359/584 |
| 6,088,163 | A | 7/2000 | Gilbert |
| 6,111,697 | A * | 8/2000 | Merrill et al. ........... 359/487.02 |
| 6,157,490 | A | 12/2000 | Wheatley |
| 6,179,948 | B1 | 1/2001 | Merrill |
| 6,207,260 | B1 * | 3/2001 | Wheatley ................. G02B 5/282 428/212 |

(56) References Cited

U.S. PATENT DOCUMENTS

| | | |
|---|---|---|
| 6,352,761 B1* | 3/2002 | Hebrink et al. .............. 428/212 |
| 6,368,699 B1 | 4/2002 | Gilbert |
| 6,449,093 B2 | 9/2002 | Hebrink |
| 6,459,514 B2* | 10/2002 | Gilbert et al. ................. 359/15 |
| 6,465,091 B1 | 10/2002 | Ou-Yang |
| 6,498,683 B2* | 12/2002 | Condo et al. ................. 359/589 |
| 6,565,982 B1* | 5/2003 | Ouderkirk et al. ........... 428/457 |
| 6,583,930 B1 | 6/2003 | Schrenk |
| 6,587,263 B1* | 7/2003 | Iacovangelo .......... F24J 2/4652 359/350 |
| 6,613,819 B2 | 9/2003 | Johnson |
| 6,641,900 B2 | 11/2003 | Hebrink |
| 6,673,425 B1 | 1/2004 | Hebrink |
| 6,697,195 B2* | 2/2004 | Weber et al. ................. 359/359 |
| 6,737,154 B2 | 5/2004 | Jonza |
| 6,744,561 B2 | 6/2004 | Condo |
| 6,783,349 B2 | 8/2004 | Neavin |
| 6,788,463 B2 | 9/2004 | Merrill |
| 6,797,366 B2 | 9/2004 | Hanson et al. |
| 6,797,396 B1 | 9/2004 | Liu |
| 6,808,658 B2 | 10/2004 | Stover |
| 6,827,886 B2 | 12/2004 | Neavin |
| 6,830,713 B2 | 12/2004 | Hebrink |
| 6,946,188 B2 | 9/2005 | Hebrink |
| 6,974,850 B2 | 12/2005 | McMan |
| 7,019,905 B2 | 3/2006 | Weber |
| 7,052,762 B2* | 5/2006 | Hebrink et al. .............. 428/212 |
| 7,055,519 B2* | 6/2006 | Litwin ........................... 126/683 |
| 7,072,333 B2 | 7/2006 | Ahn |
| 7,094,461 B2 | 8/2006 | Ruff |
| 7,141,297 B2 | 11/2006 | Condo |
| 7,153,588 B2 | 12/2006 | McMan |
| 7,190,531 B2 | 3/2007 | Dyson |
| 7,215,473 B2* | 5/2007 | Fleming .................. B32B 17/10 359/489.15 |
| 7,236,296 B2 | 6/2007 | Liu |
| 7,339,739 B1 | 3/2008 | Kinney |
| 7,345,137 B2 | 3/2008 | Hebrink |
| 7,371,464 B2 | 5/2008 | Sherman |
| 7,459,211 B2 | 12/2008 | Shih |
| 7,820,297 B2 | 10/2010 | Benson |
| 7,838,134 B2* | 11/2010 | Wolfe ............................ 428/701 |
| 8,182,924 B2 | 5/2012 | Hebrink |
| 8,445,098 B2* | 5/2013 | Medwick et al. ............ 428/220 |
| 2001/0008700 A1 | 7/2001 | Jonza |
| 2001/0019182 A1 | 9/2001 | Hebrink |
| 2001/0021445 A1* | 9/2001 | Weber et al. ................. 428/215 |
| 2002/0007845 A1 | 1/2002 | Collette |
| 2002/0015836 A1 | 2/2002 | Jonza |
| 2002/0039235 A1 | 4/2002 | Condo |
| 2002/0064671 A1 | 5/2002 | Hebrink |
| 2002/0154406 A1 | 10/2002 | Merrill |
| 2003/0020472 A1 | 1/2003 | Kretschmann |
| 2003/0053215 A1 | 3/2003 | Condo |
| 2003/0072931 A1 | 4/2003 | Hebrink |
| 2003/0082326 A1* | 5/2003 | Yang ................. B32B 17/10018 428/40.1 |
| 2003/0111519 A1 | 6/2003 | Kinney |
| 2004/0016454 A1 | 1/2004 | Murphy |
| 2004/0086690 A1 | 5/2004 | Hebrink |
| 2004/0233530 A1* | 11/2004 | Kramer ............... F21S 48/1394 359/507 |
| 2004/0242735 A1 | 12/2004 | McMan |
| 2005/0099678 A1* | 5/2005 | Wang ..................... G02B 5/208 359/359 |
| 2005/0172997 A1 | 8/2005 | Meier |
| 2006/0057398 A1 | 3/2006 | Zimmermann |
| 2006/0084780 A1 | 4/2006 | Hebrink |
| 2006/0201547 A1 | 9/2006 | Rogers |
| 2006/0266408 A1 | 11/2006 | Horne |
| 2007/0148474 A1 | 6/2007 | Leir |
| 2007/0153354 A1 | 7/2007 | Duston |
| 2007/0177272 A1 | 8/2007 | Benson |
| 2007/0193620 A1 | 8/2007 | Hines |
| 2007/0221313 A1* | 9/2007 | Franck ................... F24J 2/1057 156/91 |
| 2007/0224434 A1 | 9/2007 | Osada |
| 2007/0251569 A1 | 11/2007 | Shan |
| 2007/0256724 A1 | 11/2007 | Fork |
| 2008/0206534 A1* | 8/2008 | Brooks ............. B32B 17/10018 428/220 |
| 2008/0210292 A1 | 9/2008 | Urli |
| 2008/0251124 A1 | 10/2008 | Uehlin |
| 2008/0268219 A1 | 10/2008 | Hebrink |
| 2008/0308090 A1 | 12/2008 | Clive |
| 2008/0318065 A1 | 12/2008 | Sherman |
| 2009/0014053 A1 | 1/2009 | Schulz |
| 2009/0151769 A1* | 6/2009 | Corbin ....................... F24J 2/16 136/246 |
| 2009/0194096 A1 | 8/2009 | Simon |
| 2009/0283133 A1* | 11/2009 | Hebrink ............. H01L 31/0547 136/246 |
| 2009/0283144 A1* | 11/2009 | Hebrink ............. H01L 31/0547 136/259 |
| 2010/0018570 A1 | 1/2010 | Cashion |
| 2010/0071282 A1 | 3/2010 | Tofflemire |
| 2010/0201242 A1 | 8/2010 | Liu |
| 2011/0255155 A1 | 10/2011 | Hebrink |
| 2011/0262754 A1 | 10/2011 | Zehentmaier |
| 2012/0227809 A1* | 9/2012 | Bharti et al. ................. 136/259 |
| 2013/0070190 A1 | 3/2013 | Weber |

FOREIGN PATENT DOCUMENTS

| | | |
|---|---|---|
| CN | 201051723 Y | 4/2008 |
| CN | 201648236 | 11/2010 |
| EP | 267679 | 5/1988 |
| JP | 62-254105 | 11/1987 |
| JP | 8-110100 | 4/1996 |
| JP | 8-233373 | 9/1996 |
| JP | H08306218 | 11/1996 |
| JP | 09-166703 | 6/1997 |
| JP | 10-291839 | 11/1998 |
| JP | 11-311704 | * 11/1999 |
| JP | 2003-056455 | 2/2003 |
| WO | WO 99-36248 | 7/1999 |
| WO | WO 01-38907 | 5/2001 |
| WO | WO 2009-085662 | 7/2009 |
| WO | WO 2009-140493 | 11/2009 |
| WO | WO 2012-154793 | 11/2012 |
| WO | WO 2012-154803 | 11/2012 |

OTHER PUBLICATIONS

International Search Report for PCT/US2009/068944, mailed Feb. 15, 2010, 4 pages.

* cited by examiner

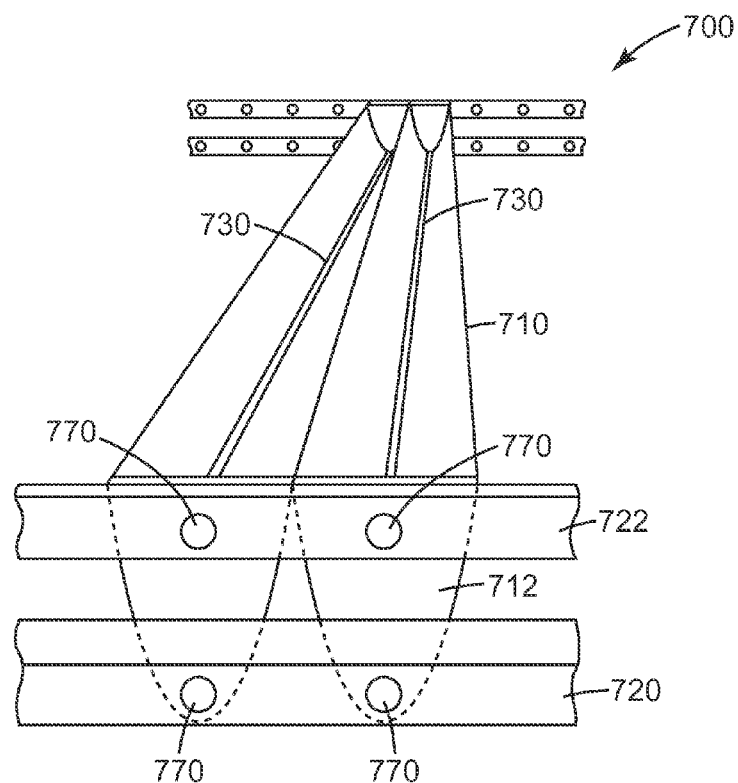
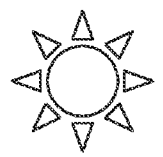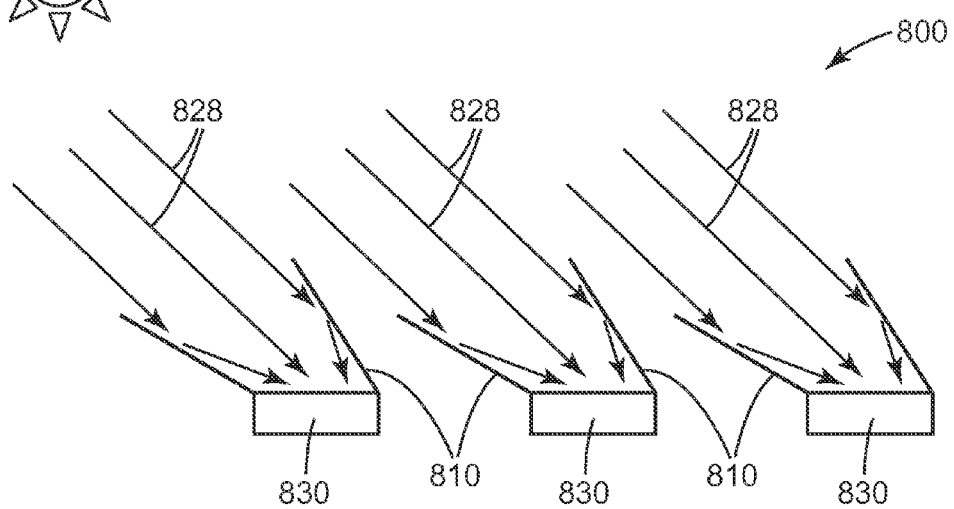
Fig. 7
Fig. 8A

BROADBAND REFLECTORS, CONCENTRATED SOLAR POWER SYSTEMS, AND METHODS OF USING THE SAME

CROSS-REFERENCE TO RELATED APPLICATIONS

This application is a national stage filing under 35 U.S.C. 371 of PCT/US2009/068944, filed Dec. 21, 2009, which claims priority to U.S. Provisional Patent Application No. 61/141,338, filed Dec. 30, 2008, and U.S. Provisional Patent Application No. 61/178,123, filed May 14, 2009, the disclosures of which are incorporated by reference herein in their entirety.

TECHNICAL FIELD

The present disclosure relates to reflectors suitable for reflecting a broad range of electromagnetic radiation, concentrated solar power systems including the reflectors, and methods of using the same.

BACKGROUND

Concentrated solar power (CSP, also known as "concentrating solar power") technology uses sunlight directed at heat transfer fluids that heat up and whose thermal energy is then transferred (e.g., for heating) or turned into electrical power (e.g., by use of a turbine generator). Conventional CSP reflectors are made with silver coated glass, which currently reflect approximately 94 percent of the solar spectrum. Such CSP reflectors are relatively expensive, heavy, and fragile.

CSP systems typically use lenses or reflectors and tracking systems to focus a large area of sunlight into a small beam. The concentrated sunlight is then used as a heat source for a conventional power plant (e.g., a steam driven turbine generator). A wide range of concentrating technologies exists; the most developed are the solar trough, parabolic dish and solar power tower.

Solar troughs are the most widely deployed and the most cost-effective CSP technology. A solar trough consists of a linear parabolic reflector that concentrates sunlight onto a receiver positioned along the reflector's focal line. The reflector is made to follow the sun during the daylight hours by tracking along a single axis.

A parabolic dish system consists of a stand-alone parabolic reflector that concentrates sunlight onto a receiver positioned at the reflector's focal point. The reflector tracks the sun along two axes. Parabolic dish systems give the highest efficiency among CSP technologies. Power towers are less advanced than trough systems but offer higher solar concentration ratios (e.g., in excess of 1000 times more) and better energy storage capability.

SUMMARY

CSP utility plants are being installed in high solar irradiation climates around the world with investment projections to exceed $200 million/year in the next 5 years. Advantageously, broadband reflectors according to the present disclosure may be fabricated with at least one of lower weight, lower cost, and/or improved power collection capability as compared to conventional reflectors used in CSP.

In one aspect, the present disclosure provides a broadband reflector comprising: an ultraviolet-reflective (UV-reflective) multilayer optical film having a first major surface and comprising a UV-reflective optical layer stack, wherein the UV-reflective optical layer stack comprises first optical layers and second optical layers, wherein at least a portion of the first optical layers and at least a portion of the second optical layers are in intimate contact and have different refractive indexes; and a visible/infrared-reflective (VIS/IR-reflective) metal layer disposed on at least a portion of the first major surface.

In another aspect, the present disclosure provides a broadband reflector comprising: a UV-reflective multilayer optical film having a first major surface and comprising a UV-reflective optical layer stack, wherein the UV-reflective optical layer stack comprises first optical layers and second optical layers, wherein at least a portion of the first optical layers and at least a portion of the second optical layers are in intimate contact and have different refractive indexes, and wherein the UV-reflective optical layer stack is reflective to UV-light; a VIS/IR-reflective multilayer optical film comprising a VIS/IR-reflective optical layer stack, wherein the VIS/IR-reflective optical layer stack comprises third optical layers and fourth optical layers, wherein at least a portion of the third optical layers and at least a portion of the fourth optical layers are in intimate contact and have different refractive indexes, and wherein the VIS/IR-reflective multilayer optical film is reflective to VIS/IR-light; and a UV-absorbing layer disposed between the UV-reflective multilayer optical film and the VIS/IR-reflective multilayer optical film. In some embodiments, the first optical layers and second optical layers and/or the third optical layers and fourth optical layers respectively comprise a polyethylene terephthalate and a THV, a polyethylene terephthalate and an OTP, a PEN and a THV, a PEN and an OTP, a PEN and a PMMA, a polyethylene terephthalate and a coPMMA, a PEN and a coPMMA layer pairs, a coPEN and a PMMA layer pairs, a coPEN and an OTP, a coPEN and a THV, a sPS and an OTP, a sPS and a THV, a PMMA and a THV, a COC and a THV, or an EVA and a THV layer pairs.

In some embodiments, the UV-reflective multilayer optical film further comprises a tie layer that forms the first major surface of the UV-reflective multilayer optical film. In some of those embodiments, the tie layer comprises an inorganic tie layer. In some embodiments, the inorganic tie layer comprises titanium dioxide or aluminum oxide. In some embodiments, the VIS/IR-reflective metal layer comprises at least one of silver, copper, stainless steel, or aluminum (i.e., comprises silver, copper, stainless steel, aluminum, or any combination thereof).

In another aspect, the present disclosure provides a broadband reflector comprising: a UV-reflective multilayer optical film having a first major surface and comprising a UV-reflective optical layer stack, wherein the UV-reflective optical layer stack comprises first optical layers and second optical layers, wherein at least a portion of the first optical layers and at least a portion of the second optical layers are in intimate contact and have different refractive indexes, and wherein the UV-reflective optical layer stack is reflective to UV-light; a VIS/IR-reflective multilayer optical film comprising a VIS/IR-reflective optical layer stack, wherein the VIS/IR-reflective optical layer stack comprises third optical layers and fourth optical layers, wherein at least a portion of the third optical layers and at least a portion of the fourth optical layers are in intimate contact and have different refractive indexes, and wherein the VIS/IR-reflective multilayer optical film is reflective to VIS/IR-light; and a UV-absorbing layer disposed between the UV-reflective multilayer optical film and the VIS/IR-reflective multilayer optical film.

In some embodiments, the broadband reflector has an average light reflectivity of at least 95 percent over a wavelength range of 350 to 400 nanometers. In some embodiments, the broadband reflector has an average light reflectivity of at least 90 percent over a wavelength range of from 300 to 2494 nanometers.

In some embodiments, the UV-reflective multilayer optical film further comprises a second major surface opposite the first major surface, and wherein the UV-reflective multilayer optical film further comprises an abrasion resistant layer that forms the second major surface of the UV-reflective multilayer optical film. In some of those embodiments, the abrasion resistant layer comprises: an antisoiling component selected from the group consisting of fluoropolymers, silicone polymers, titanium dioxide particles, polyhedral oligomeric silsesquioxanes, and combinations thereof. In some embodiments, the abrasion resistant layer comprises a conductive filler; for example, to facilitate static charge dissipation.

In some embodiments, the broadband reflector is thermoformable. In some embodiments, the broadband reflector has a parabolic or curved surface.

In yet another aspect, the present disclosure provides a concentrated solar power system comprising: at least one broadband reflector according to the present disclosure and capable of being aligned to direct solar radiation onto a hollow receiver; and a heat transfer fluid partially disposed within the hollow receiver.

In some embodiments, the concentrated solar power system further comprises an electrical generator in fluid communication with the hollow receiver.

In some embodiments, the concentrated solar power system further comprises a celestial tracking mechanism for the at least one broadband reflector. The at least one broadband reflector may, for example, be pivotally mounted on a frame. In some embodiments, both the hollow receiver and the at least one broadband reflector are pivotally mounted on a frame. The pivotally mounted components may pivot, for example, in one direction or in two directions. In some embodiments, the hollow receiver is stationary.

In yet another aspect, the present disclosure provides a method of harnessing solar energy, the method comprising reflecting solar radiation using at least one broadband reflector according to the present disclosure onto a hollow receiver containing a heat transfer fluid to provide a heated heat transfer fluid.

In some embodiments, the method further comprises thermally heating at least a portion of a building with heat given off from the heated heat transfer fluid. In some embodiments, the method further comprises generating electrical power using the heated heat transfer fluid.

In yet another aspect, the present disclosure provides a broadband reflector comprising:

a UV-reflective multilayer optical film having a first major surface and comprising a UV-reflective optical layer stack, wherein the UV-reflective optical layer stack comprises first optical layers and second optical layers, wherein at least a portion of the first optical layers and at least a portion of the second optical layers are in intimate contact and have different refractive indexes;

an adhesive layer disposed on at least a portion of the first major surface; and a VIS/IR-reflective metallic substrate disposed on at least a portion of the adhesive layer.

In some embodiments, the adhesive layer comprises a pressure-sensitive adhesive layer.

In this application:

"light" refers to electromagnetic radiation, whether visible to the unaided human eye or not;

"optical layer" means having a layer of a material having a thickness in a range of about one quarter of a wavelength or wavelengths of light to be reflected (e.g., optical layer in the context of a UV-reflective optical layer stack means a layer of material having a thickness of about one quarter of a wavelength of UV-light, while optical layer in the context of a VIS/IR-reflective optical layer stack means a layer of material having a thickness of about one quarter of a wavelength of VIS/IR-light;

"polymer" refers to a macromolecular compound consisting essentially of one or more repeated monomeric units, or a mixture of macromolecular compounds that consist essentially of one or more like repeated monomeric units;

"UV-absorber" means a material capable of absorbing or blocking electromagnetic radiation at wavelengths less than 380 nanometers (nm), while remaining substantially transparent at wavelengths greater than 400 nm;

"UV-light" means electromagnetic radiation having a wavelength in a range of from greater than 350 to 400 nm;

"UV-reflective" means substantially reflective to UV-light (for example, at least 30, 40, 50, 60, 70, 80, 90, or 95 percent reflective to at least a portion of UV-light at a 90 degree angle of incidence);

"UV-absorbing" means substantially absorbing at normal incidence (90 degree angle of incidence) of light at least some wavelengths in a range of from 300 to 400 nanometers (for example, at least 30, 40, 50, 60, 70, 80, 90, or 95 percent absorbing of light at wavelengths in a range of from 300 to 400 nm);

"VIS/IR-light" means electromagnetic radiation having a wavelength in a range of from greater than 400 to 2494 nm; and VIS/IR-reflective" means substantially reflective to VIS/IR-light (for example, at least 30, 40, 50, 60, 70, 80, 90, or 95 percent reflective at normal incidence to light at wavelengths in a range of from greater than 400 to 2494 nm).

BRIEF DESCRIPTION OF THE DRAWINGS

The disclosure may be more completely understood in consideration of the following detailed description of various embodiments of the disclosure in connection with the accompanying drawings, in which:

FIG. 7 is a schematic diagram of an embodiment of a tracker device for moving linear parabolic broadband reflectors disclosed herein mounted in a frame;

FIG. 8a is a diagram showing an embodiment of an array of hollow receivers with louvers comprising the broadband reflectors disclosed herein, wherein the louvers are oriented to enhance capture of rays from the morning sun;

DETAILED DESCRIPTION

Figure 1A:
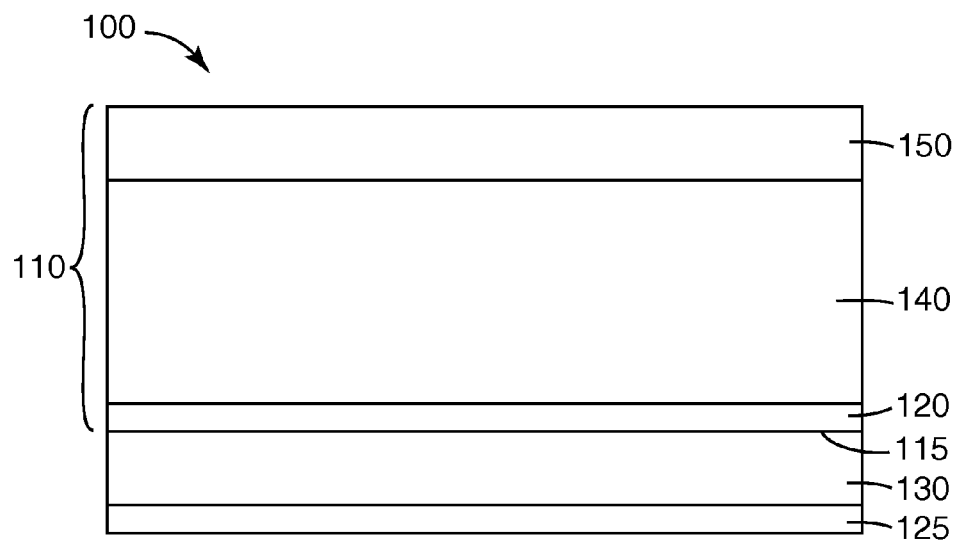
FIG. 1A is a schematic side view of a broadband reflector 100 according to one embodiment of the present disclosure.

Referring now to FIG. 1A, broadband reflector 100 according to one exemplary embodiment of the present disclosure has UV-reflective multilayer optical film 110 with first major surface 115 and UV-reflective optical layer stack 140. VIS/IR-reflective metal layer 130 is disposed on at least a portion of first major surface 115. UV-reflective multilayer optical film 110 may contain additional layers such as, for example, optional tie layer 120 and optional abrasive resistant hardcoat 150. UV-reflective multilayer optical film 110 reflects UV-light while VIS/IR-light that is transmitted through UV-reflective multilayer optical film 110 is reflected by VIS/IR-reflective metal layer 130. Optional adhesive layer 125 is disposed on metal layer 130 opposite UV-reflective multilayer optical film 110.

Figure 1B:
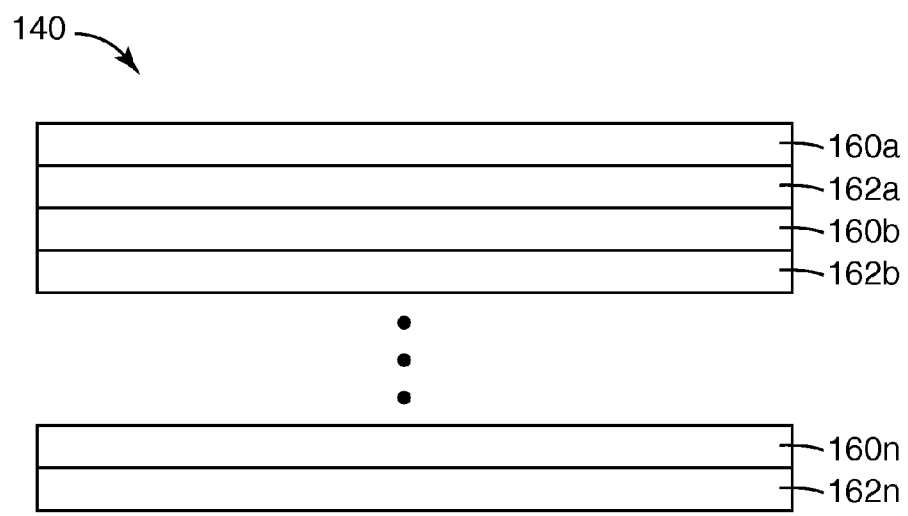
FIG. 1B is a schematic side view of a UV-reflective optical layer stack 140 included in broadband reflector 100.

UV-reflective optical layer stack 140 will be better understood with reference to FIG. 1B. UV-reflective optical layer stack 140 comprises first optical layers 160a, 160b, . . . , 160n (collectively first optical layers 160) in intimate contact with second optical layers 162a, 162b, . . . , 162n (collectively second optical layers 162). First optical layers 160 and second optical layers 162 have respective refractive indexes that are different. Accordingly, a reflection is generated at each interface between the adjacent optical layers. Light that is not reflected at the interface between adjacent optical layers typically passes through successive layers and is either reflected at a subsequent interface or passes through the UV-reflective optical layer stack altogether.

The normal reflectivity for a particular layer pair is primarily dependent on the optical thickness of the individual layers, where optical thickness is defined as the product of the actual thickness of the layer times its refractive index. The intensity of light reflected from the optical layer stack is a function of its number of layer pairs and the differences in refractive indices of optical layers in each layer pair. The ratio $n_1d_1/(n_1d_1+n_2d_2)$ (commonly termed the "f-ratio") correlates with reflectivity of a given layer pair at a specified wavelength. In the f-ratio, $n_1$ and $n_2$ are the respective refractive indexes at the specified wavelength of the first and second optical layers in a layer pair, and $d_1$ and $d_2$ are the respective thicknesses of the first and second optical layers in the layer pair. By proper selection of the refractive indexes, optical layer thicknesses, and f-ratio one can exercise some degree of control over the intensity of first order reflection. For example, first order visible reflections of violet (400 nanometers wavelength) to red (700 nanometers wavelength) can be obtained with layer optical thicknesses between about 0.05 and 0.3 nanometers. In general, deviation from an f-ratio of 0.5 results in a lesser degree of reflectivity.

The equation $\lambda/2=n_1d_1+n_2d_2$ can be used to tune the optical layers to reflect light of wavelength $\lambda$ at a normal angle of incidence. At other angles, the optical thickness of the layer pair depends on the distance traveled through the component optical layers (which is larger than the thickness of the layers) and the indices of refraction for at least two of the three optical axes of the optical layer. The optical layers can each be a quarter-wavelength thick or the optical thin layers can have different optical thicknesses, as long as the sum of the optical thicknesses is half of a wavelength (or a multiple thereof). An optical stack having more than two layer pairs can include optical layers with different optical thicknesses to provide reflectivity over a range of wavelengths. For example, an optical stack can include layer pairs that are individually tuned to achieve optimal reflection of normally incident light having particular wavelengths or may include a gradient of layer pair thicknesses to reflect light over a larger bandwidth.

A typical approach is to use all or mostly quarter-wave film stacks. In this case, control of the spectrum requires control of the layer thickness profile in the film stack. A broadband spectrum, such as one required to reflect visible light over a large range of angles in air, still requires a large number of layers if the layers are polymeric, due to the relatively small index differences achievable with polymer films compared to inorganic films. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

Desirable techniques for providing a multilayer optical film with a controlled spectrum include:

1) The use of an axial rod heater control of the layer thickness values of coextruded polymer layers as taught in U.S. Pat. No. 6,783,349 (Neavin et al.).
2) Timely layer thickness profile feedback during production from a layer thickness measurement tool such as e.g. an atomic force microscope (AFM), a transmission electron microscope, or a scanning electron microscope.
3) Optical modeling to generate the desired layer thickness profile.
4) Repeating axial rod adjustments based on the difference between the measured layer profile and the desired layer profile.

The basic process for layer thickness profile control involves adjustment of axial rod zone power settings based on the difference of the target layer thickness profile and the measured layer profile. The axial rod power increase needed to adjust the layer thickness values in a given feedblock zone may first be calibrated in terms of watts of heat input per nanometer of resulting thickness change of the layers generated in that heater zone. Fine control of the spectrum is possible using 24 axial rod zones for 275 layers. Once calibrated, the necessary power adjustments can be calculated once given a target profile and a measured profile. The procedure is repeated until the two profiles converge.

The layer thickness profile (layer thickness values) of this UV reflector can be adjusted to be approximately a linear profile with the first (thinnest) optical layers adjusted to have about a ¼ wave optical thickness (index times physical thickness) for 340 nm light and progressing to the thickest layers which can be adjusted to be about ¼ wave thick optical thickness for 420 nm light.

The UV-reflective optical layer stack comprises first optical layers and second optical layers, which have an average individual layer thickness of about one quarter the wavelength of UV-light, and a layer pair thickness of about one half the wavelength of UV-light. For example, at 400 nanometers (nm) the average individual layer thickness would be about 100 nm, and the average layer pair thickness would be about 200 nm. Similarly, at 350 nm the average individual layer thickness would about 87 nm, and the average layer pair thickness would be about 175 nm. Of course, true thickness will typically vary such that a range of thickness (and hence reflective response) will be obtained. Further, the thickness of individual first and/or second optical layers may be varied, for example, according to a thickness gradient in which the first and/or second layers gradually become thicker (or thinner) with respect to the first major surface, thereby achieving a broadband reflective response (i.e., UV-light and VIS/IR-light).

Since reflectivity at a given interface is typically relatively low, the number of the optical layers is typically large (e.g., at least 100, 250, 500, or even at least 1000 optical layers) such that the total light reflectivity is high.

In order for an optical layer stack to function efficiently, the first and second optical layers (or, as described hereinbelow, third and fourth optical layers in the case of a UV/IR optical layer stack) at least a portion, typically all or substantially all, of any two optical layers that are in intimate contact (i.e., a layer pair) have a refractive index difference that results in reflection of a portion of any light traversing the interface between the optical layers.

An exemplary layer pair 164a is shown in FIG. 1B. Typically, the optical layers of a given layer pair are selected such as to be substantially transparent to those light wavelengths at which reflectivity is desired. Light that is not reflected at a layer pair interface passes to the next layer pair interface where a portion of the light is reflected and unreflected light continues on, and so on. In this way, an optical layer stack (e.g., a UV-reflective optical layer stack or a VIS/IR-reflective optical layer stack) with many optical layers (e.g., more than 100 optical layers) is capable of generating a high degree of reflectivity, which may be broadband. The difference in refractive index, with respect to at least one dimension, between layers of the layer pair is typically 0.05 or larger, more typically at least 0.1, although lesser differences may also be used if desired.

Birefringence (e.g., caused by stretching) of optical layers is an effective method for increasing the difference in refractive index of the optical layers in a layer pair. Multilayer reflective optical films that include layer pairs are oriented in two mutually perpendicular in-plane axes are capable of reflecting an extraordinarily high percentage of incident light depending on the number of optical layers, f-ratio, indices of refraction, etc., and are highly efficient reflectors. Reflectors can also be made using a combination of uniaxially-oriented layers with in-plane indices of refraction that differ significantly.

As shown in FIG. 1B, the layer pairs may be arranged as alternating layer pairs (e.g., ABABAB . . . ). In other embodiments, they may also be arranged with intermediate layers such as, for example, a third optical layer (e.g., ABCABC . . . ) or in non-alternating fashion (e.g., ABABABCAB . . . , ABABCABDAB . . . or ABABBAABAB . . . , etc.). Typically, the layer pairs are arranged as alternating layer pairs.

The optional abrasion resistant layer may comprise any abrasion resistant material that is transparent to the wavelengths of UV-light and VIS/IR-light reflected by the broadband reflector. Examples of scratch resistant coatings include: a thermoplastic urethane available as TECOFLEX from Lubrizol Advanced Materials, Inc, Cleveland, Ohio, ??containing 5 weight percent of a UV absorber available as TINUVIN 405 from Ciba Specialty Chemicals Corp., 2 weight percent of a hindered amine light stabilizer available as TINUVIN 123, and 3 weight percent of a UV-absorber available as TINUVIN 1577 from Ciba Specialty Chemicals Corp. and a scratch resistant coating preparable by curing a curable siliceous polymer composition available as PERMA-NEW 6000 (or PERMA-NEW 6000B) CLEAR HARD COATING SOLUTION from California Hardcoating Co. of Chula Vista, Calif.

The abrasion resistant layer may have any suitable thickness, typically depending on the choice of abrasion resistant material used. Typical abrasion resistant layer thicknesses are on the order of 1 to 10 micrometers, more typically 3 to 6 micrometers, although other thicknesses may be used.

The optional abrasion resistant layer may optionally include at least one antisoiling component. Examples of antisoiling components include fluoropolymers, silicone polymers, and titanium dioxide particles, fluoropolymers, silicone polymers, titanium dioxide particles, polyhedral oligomeric silsesquioxanes (e.g., as available as POSS from Hybrid Plastics of Hattiesburg, Miss.), and combinations thereof. The abrasion resistant layer may also comprise a conductive filler, typically a transparent conductive filler. The abrasion resistant layer may also comprise an inherently static dissipative polymer such as those available as STATRITE X5091 or STATRITE M809 from Lubrizol Corp.

If present, the optional tie layer facilitates adhesion of the VIS/IR-reflective metal layer to the UV-reflective multilayer optical film. The tie layer may be organic (e.g., a polymeric layer or adhesive), inorganic, or other. Exemplary inorganic tie layers include amorphous silica, silicon monoxide, and metal oxides (e.g., tantalum pentoxide, titanium dioxide, and aluminum oxide). The tie layer may be provided by any suitable means, including vapor coating, solvent casting, and powder coating techniques. In order that it does not degrade performance of the broadband reflector, the optional tie layer is typically substantially not absorptive of light (e.g., having an absorbance of less than 0.1, less than 0.01, less than 0.001, or less than 0.0001) over the wavelength range of from greater than 400 to 2494 nm.

The VIS/IR-reflective metal layer may comprise any metal or metals that reflects VIS/IR light, typically efficiently. In general, the VIS/IR-reflective metal layer should be at least about 100 nm thick to ensure high reflectivity. Exemplary metals include silver, copper, aluminum, copper on silver, nichrome, stainless steel, and nickel. The metal layer may be secured to the UV-reflective multilayer optical film by any suitable technique including lamination, sputtering, and vapor coating. For example, the metal layer may be provided by laminating the UV-reflective multilayer optical film to polished aluminum stock, silver coated aluminum stock, polished stainless steel stock, and silver coated glass (including retro-fitting existing silver coated glass CSP troughs). In some embodiments, the metal layer includes a VIS/IR-reflective foil, a vapor coated metal surface (e.g., front surface VIS/IR-reflective metal layers on a glass or polymeric backing), or metallic sheet stock.

Figure 2A:
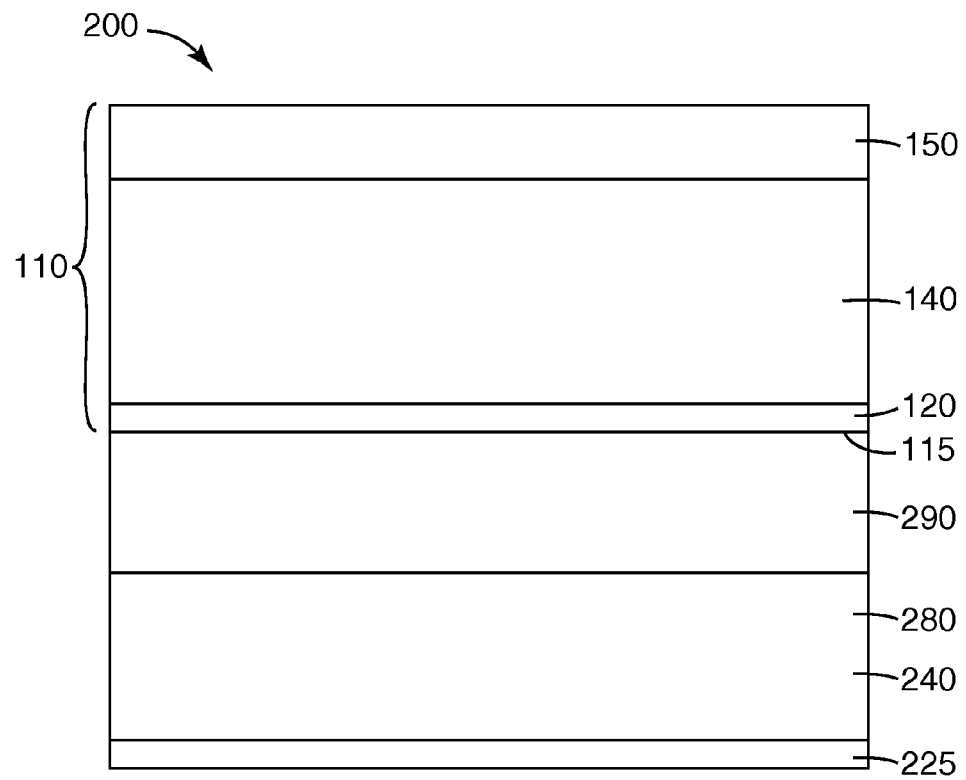
FIG. 2A is a schematic side view of a broadband reflector 200 according to another embodiment of the present disclosure.

Referring now to FIG. 2A, a broadband reflector 200 according to another exemplary embodiment of the present disclosure has UV-reflective multilayer optical film 110 with first major surface 115, UV-reflective optical layer stack 140, optional tie layer 120, and optional abrasive resistant hardcoat 150. VIS/IR-reflective multilayer optical film 280 comprises VIS/IR-reflective optical layer stack 240. Optional adhesive layer 225 is disposed on at least a portion of VIS/IR-reflective multilayer optical film 280 opposite UV-reflective multilayer optical film 110.

Figure 2B:
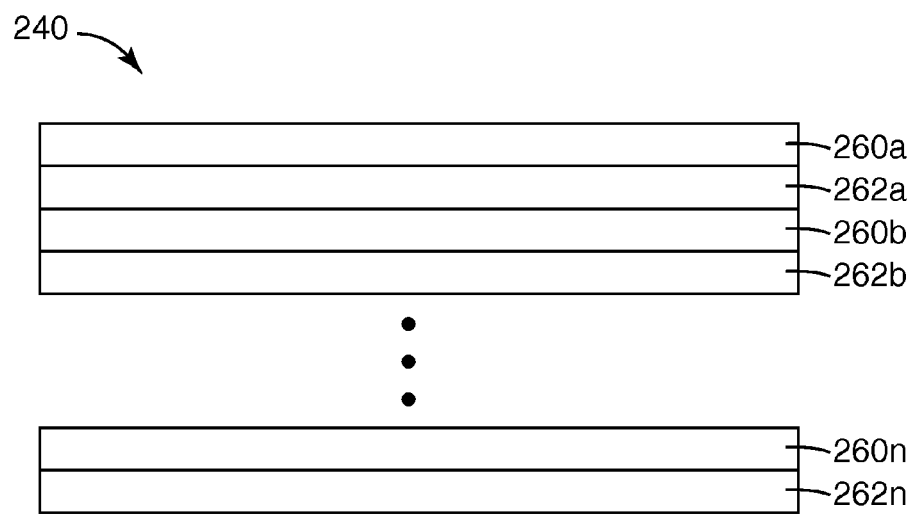
FIG. 2B is a schematic side view of a VIS/IR-reflective optical layer stack 240 included in broadband reflector 200.

Referring now to FIG. 2B, VIS/IR-reflective optical layer stack 240 comprises third optical layers 260a, 260b, . . . , 260n (collectively third optical layers 260) and fourth optical layers 262a, 262b, . . . , 262n (collectively fourth optical layers 262) analogous to the first and second optical layers 160, 162, but of different thickness and optionally composition. VIS/IR-reflective optical layer stack 240 may be constructed generally as in UV-reflective optical layer stack 140 except for optical layer thicknesses that will differ due to the wavelength difference. Materials selection for third and fourth optical layers may be the same or different as the first and second optical layers of UV-reflective optical layer stack 140 as desired.

Referring again to FIG. 2A, UV-absorbing layer 290 is disposed (e.g., sandwiched) between UV-reflective multilayer optical film 110 and VIS/IR-reflective multilayer optical film 280, which is reflective to VIS/IR-light.

The UV-absorbing layer is disposed between the UV-reflective multilayer optical film and the VIS/IR multilayer optical film, and serves to absorb UV-light that would otherwise impinge on the VIS/IR-reflective multilayer optical film and could lead to degradation over time. Solar light, in particular the ultraviolet radiation from 280 to 400 nm, can induce degradation of plastics, which in turn results in color change and deterioration of optical and mechanical properties. Inhibition of photo-oxidative degradation is important for outdoor applications wherein long term durability is mandatory. The absorption of UV-light by polyethylene terephthalates, for example, starts at around 360 nm, increases markedly below 320 nm, and is very pronounced at below 300 nm. Polyethylene naphthalates strongly absorb UV-light in the 310-370 nm range, with an absorption tail extending to about 410 nm, and with absorption maxima occurring at 352 nm and 337 nm. Chain cleavage occurs in the presence of oxygen, and the predominant photooxidation products are carbon monoxide, carbon dioxide, and carboxylic acids. Besides the direct photolysis of the ester groups, consideration has to be given to oxidation reactions, which likewise form carbon dioxide via peroxide radicals.

The UV-absorbing layer comprises a polymer and a UV-absorber. Typically, the polymer is a thermoplastic polymer, but this is not a requirement. Examples of suitable polymers include polyesters (e.g., polyethylene terephthalate), fluoropolymers, acrylics (e.g., polymethyl methacrylate), silicone polymers (e.g., thermoplastic silicone polymers), styrenic polymers, polyolefins, olefinic copolymers (e.g., copolymers of ethylene and norbornene available as TOPAS COC from Topas Advanced Polymers of Florence, Ky.), silicone copolymers, fluoropolymers, and combinations thereof (e.g., a blend of polymethyl methacrylate and polyvinylidene fluoride).

The UV-absorbing layer protects the VIS/IR-reflective optical layer stack from UV-light caused damage by absorbing any UV-light that may pass through the UV-reflective optical layer stack. In general, the UV-absorbing layer may include any polymeric composition (i.e., polymer plus additives), including pressure-sensitive adhesive compositions, that is capable of withstanding UV-light for an extended period of time.

A variety of ultraviolet light absorbing and stabilizing additives are typically incorporated into the UV-absorbing layer to assist in its function of protecting the VIS/IR-reflective multilayer optical film. Non-limiting examples of the additives include one or more compounds selected from ultraviolet light absorbers, hindered amine light stabilizers, antioxidants, and combinations thereof.

UV stabilizers such as UV-absorbers are chemical compounds that can intervene in the physical and chemical processes of photoinduced degradation. The photooxidation of polymers from ultraviolet radiation can therefore be prevented by use of a UV-absorbing layer that contains at least one UV-absorber to effectively absorb light at wavelengths less than about 400 nm. UV-absorbers are typically included in the UV-absorbing layer in an amount that absorb at least 70 percent, typically 80 percent, more typically greater than 90 percent, or even greater than 99 percent of incident light in a wavelength region from 180 to 400 nm.

Typical UV-absorbing layer thicknesses are from 10 to 500 micrometers, although thinner and thicker UV-absorbing layers may also be used. Typically, the UV-absorber is present in the UV-absorbing layer in an amount of from 2 to 20 percent by weight, but lesser and greater levels may also be used.

One exemplary UV-absorber is a benzotriazole compound, 5-trifluoromethyl-2-(2-hydroxy-3-alpha-cumyl-5-tert-octylphenyl)-2H-benzotriazole. Other exemplary benzotriazoles include 2-(2-hydroxy-3,5-di-alpha-cumylphenyl)-2H-benzotriazole, 5-chloro-2-(2-hydroxy-3-tert-butyl-5-methylphenyl)-2H-benzothiazole, 5-chloro-2-(2-hydroxy-3,5-di-tert-butylphenyl)-2H-benzotriazole, 2-(2-hydroxy-3,5-di-tert-amylphenyl)-2H-benzotriazole, 2-(2-hydroxy-3-alpha-cumyl-5-tert-octylphenyl)-2H-benzotriazole, 2-(3-tert-butyl-2-hydroxy-5-methylphenyl)-5-chloro-2H-benzotriazole. Additional exemplary UV-absorbers include 2(-4,6-diphenyl-1-3,5-triazin-2-yl)-5-hexyloxy-phenol, and those available from Ciba Specialty Chemicals Corp. as TINUVIN 1577 and TINUVIN 900. In addition, UV-absorber(s) can be used in combination with hindered amine light stabilizer(s) (HALS) and/or antioxidants. Exemplary HALSs include those available from Ciba Specialty Chemicals Corp. as CHIMASSORB 944 and TINUVIN 123. Exemplary antioxidants include those available as IRGANOX 1010 and ULTRANOX 626 from Ciba Specialty Chemicals Corp.

In addition to adding UVA, HALS, and antioxidants to the UV-absorbing layer, the UVA, HALS, and antioxidants can be added to other layers present in broadband reflectors according to the present disclosure.

Other additives may be included in the UV-absorbing layer. Small particle non-pigmentary zinc oxide and titanium oxide can also be used as blocking or scattering additives in the UV-absorbing layer. For example, nanoscale (i.e., nanometer-scale) particles can be dispersed in polymer or coating substrates to minimize ultraviolet radiation degradation. The nanoscale particles are transparent to visible light while either scattering or absorbing harmful UV radiation thereby reducing damage to thermoplastics. U.S. Pat. No. 5,504,134 (Palmer et al.) describes attenuation of polymer substrate degradation due to ultraviolet radiation through the use of metal oxide particles in a size range of about 0.001 micrometer to about 0.20 micrometer in diameter, and more preferably from about 0.01 to about 0.15 micrometers in diameter. U.S. Pat. No. 5,876,688 (Laundon) teaches a method for producing micronized zinc oxide that are small enough to be transparent when incorporated as ultraviolet light (UV) blocking and/or scattering agents in paints, coatings, finishes, plastic articles, and cosmetics, which are well suited for use in the present invention. These fine particles such as zinc oxide and titanium oxide with particle size ranged from 10-100 nm that can attenuate UV radiation are commercially available from Kobo Products, Inc., South Plainfield, N.J. Flame retardants may also be incorporated as an additive in the UV-absorbing layer.

The thickness of the UV-absorbing layer is dependent upon an optical density target at specific wavelengths as calculated by the Beer-Lambert Law. In typical embodiments, the UV-absorbing layer has an optical density greater than 3.5 at 380 nm; greater than 1.7 at 390; and greater than 0.5 at 400 nm. Those of ordinary skill in the art will recognize that the optical densities must remain fairly constant over the extended life of the article in order to provide the intended protective function.

In general, UV-reflective multilayer optical films and VIS/IR-reflective multilayer optical films are specular reflectors, although this is not a requirement. Both multilayer reflective optical films rely on index of refraction differences between at least two different materials (typically polymeric materials (e.g., polymers or combinations of polymers)).

The first and third optical layers are typically birefringent layers that comprise respective first and third polymers, which may be single polymers or combinations of polymers, which are uniaxially-oriented or biaxially-oriented to create a sufficiently high refractive index difference between the first and second optical layers or third and fourth optical layers, although this is not a requirement. High reflectivity can also be achieved by increasing the number of layers for optical pairs with less refractive difference between first and second optical layers. In those embodiments wherein the first optical layer is birefringent, the first polymer is typically capable of developing a large birefringence when stretched. Depending on the application, the birefringence may be developed between two orthogonal directions in the plane of the film, between one or more in-plane directions and the direction perpendicular to the film plane, or a combination of these. The first polymer should maintain birefringence after stretching, so that the desired optical properties are imparted to the finished film.

The second and fourth optical layers can be layers comprising respective second and fourth polymers, which may be single polymers or combinations of polymers, that are birefringent and uniaxially- or biaxially-oriented or the second optical layers can have an isotropic index of refraction that is different from at least one of the indices of refraction of the respective first and third optical layers after orientation. The second and fourth polymers advantageously develop little or no birefringence when stretched, or develops birefringence of the opposite sense (positive-negative or negative-positive), such that its film-plane refractive indices differ as much as possible from those of the first (or third) polymers in the finished film. For most applications, it is advantageous that neither the first polymer nor the second polymer absorb incident light within the bandwidth of interest for the film in question, resulting in all incident light within the bandwidth being either reflected or transmitted. However, some level of absorbance may be acceptable for some applications:

The first, second, third, and fourth optical layers may comprise one or more polymers (including miscible polymer blends). Useful classes of polymers include polyesters and polycarbonates.

Polyesters may be derived, for example, from ring-opening addition polymerization of a lactone, or by condensation of a dicarboxylic acid (or derivative thereof such as, for example, a diacid halide or a diester) with a diol. Exemplary dicarboxylic acids include: 2,6-naphthalenedicarboxylic acid; terephthalic acid; isophthalic acid; phthalic acid; azelaic acid; adipic acid; sebacic acid; norbornanedicarboxylic acid; bicyclooctanedicarboxylic acid; 1,6-cyclohexanedicarboxylic acid; t-butyl isophthalic acid, trimellitic acid, sodium sulfonated isophthalic acid; 4,4'-biphenyldicarboxylic acid. Acid halides and lower alkyl esters of these acids, such as methyl or ethyl esters may also be used as functional equivalents. The term "lower alkyl" refers, in this context, to alkyl groups having from one to ten carbon atoms. Exemplary diols include: ethylene glycol; propylene glycol; 1,4-butanediol; 1,6-hexanediol; neopentyl glycol; polyethylene glycol; diethylene glycol; tricyclodecanediol; 1,4-cyclohexanedimethanol; norbornanediol; bicyclooctanediol; trimethylolpropane; pentaerythritol; 1,4-benzenedimethanol; bisphenol A; 1,8-dihydroxybiphenyl; and 1,3-bis (2-hydroxyethoxy)benzene.

Exemplary polymers useful for forming birefringent optical layers include, for example: polyethylene terephthalates (PETs) (e.g., a PET having an inherent viscosity of 0.74 dL/g, available from Eastman Chemical Company (Kingsport, Tenn.)); polyethylene 2,6-naphthalates (PENs); copolyesters derived from naphthalenedicarboxylic acid, an additional dicarboxylic acid, and a diol (coPENs) (e.g., a polyester derived through co-condensation of 90 equivalents of dimethyl naphthalenedicarboxylate, 10 equivalents of dimethyl terephthalate, and 100 equivalents of ethylene glycol, and having an intrinsic viscosity (IV) of 0.48 dL/g, and an index of refraction is approximately 1.63); polyether imides; and polyester/non-polyester combinations; polybutylene 2,6-naphthalates (PBNs); modified polyolefin elastomers, e.g., as available as ADMER (e.g., ADMER SE810) thermoplastic elastomers from Mitsui Chemicals America, Inc. of Rye Brook, N.Y.; and copolyesters derived from terephthalic acid such as those described in U.S. Pat. No. 6,449,093 B2 (Hebrink et al.) or U.S. Pat. App. Publ. No. 2006/0084780 A1 (Hebrink et al.); thermoplastic polyurethanes (TPUs) (e.g., as available as ELASTOLLAN TPUs from BASF Corp. of Florham Park, N.J. and as TECOFLEX or STATRITE TPUs (e.g., STATRITE X5091 or STATRITE M809) from The Lubrizol Corp. of Wickliffe, Ohio); and syndiotactic polystyrenes (sPSs), which is particularly useful due to its low UV-light absorbance; and combinations thereof.

PEN has a large positive stress optical coefficient, retains birefringence effectively after stretching, and has little or no absorbance within the visible range. PEN also has a large index of refraction in the isotropic state. Its refractive index for polarized incident light of 550 nm wavelength increases when the plane of polarization is parallel to the stretch direction from about 1.64 to as high as about 1.9. Increasing molecular orientation increases the birefringence of PEN. The molecular orientation may be increased by stretching the material to greater stretch ratios and holding other stretching conditions fixed. coPENs such as those described in U.S. Pat. Nos. 6,352,761 B1 and 6,449,093 B2 (both to Hebrink et al.) are particularly useful for their low temperature melt processing capability.

Exemplary melt-processible polymers useful in non-birefringent optical layers include: polyesters (e.g., polycyclohexanedimethylene terephthalate commercially available from Eastman Chemical Co, Kingsport, Tenn.); polysulfones; polyurethanes; polyamides; polyimides; polycarbonates; polydimethylsiloxanes; polydiorganosiloxane polyoxamide block copolymers (OTPs) such as, e.g., those described in U.S. Publ. Pat. Appln. Nos. 2007/0148474 A1 (Leir et al.) and 2007/0177272 A1 (Benson et al.); fluoropolymers including, e.g., homopolymers such as polyvinylidene difluoride (PVDFs), copolymers such as copolymers of tetrafluoroethylene, hexafluoropropylene, and vinylidene fluoride (THVs), copolymers of hexafluoropropylene, tetrafluoroethylene, and ethylene (HTEs); copolymers of tetrafluoroethylene and norbornene; copolymers of ethylene and tetrafluoroethylene (ETFEs); copolymers of ethylene and vinyl acetate (EVAs); copolymers of ethylene and chlorotrifluoroethylene (ECTFEs), and fluoroelastomers; acrylics such as polymethyl methacrylate (PMMA, e.g., as available as CP71 and CP80 from Ineos Acrylics, Inc. of Wilmington, Del.) and copolymers of methyl methacrylate (coPMMAs) such as, e.g., a coPMMA made from 75 weight percent methyl methacrylate and 25 weight percent ethyl acrylate (available from Ineos Acrylics, Inc., as PERSPEX CP63) and a coPMMA formed from methyl methacrylate and n-butyl methacrylate; styrenic polymers; vinyl acetate copolymers (e.g., ethylene vinyl acetate copolymers); copolymers of ethylene and a cyclic olefin (COCs); blend of PMMA and PVDF (e.g., as available from Solvay Polymers, Inc., Houston, Tex., as SOLEF); polyolefin copolymers such as poly(ethylene-co-octene) (PE-POs) available from Dow Chemical Co., Midland, Mich. as ENGAGE 8200, poly(propylene-co-ethylene) (PPPE) available from Fina Oil and Chemical Co., Dallas, Tex. as Z9470, and a copolymer of atactic polypropylene (aPPs) and isotactic polypropylene (iPPs) available from Huntsman Chemical Corp., Salt Lake City, Utah as REXFLEX W111; and combinations thereof. Second optical layers can also be made from a functionalized polyolefin, such as linear low density polyethylene-g-maleic anhydride (LLDPE-g-MA) such as that available from E. I. du Pont de Nemours & Co., Inc., Wilmington, Del. as BYNEL 4105; and combinations thereof.

In some embodiments, the melt-processible copolymers of tetrafluoroethylene and other monomer(s), described above, include additional monomers such as, e.g., propylene, ethylene, norbornene, and/or perfluorinated vinyl ethers represented by the formula:

$$CF_2=CF(OCF_2CF(R_f))_aOR'_f$$

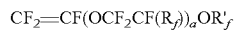

wherein $R_f$ is a perfluoroalkyl group having from 1 to 8 (typically 1 to 3 carbon atoms), and $R'_f$ is a perfluoroaliphatic group, typically a perfluoroalkyl or perfluoroalkoxy group having from 1 to 8 (typically 1 to 3 carbon atoms), and a is 0, 1, 2, or 3. Exemplary perfluorinated vinyl ethers having this formula include: $CF_2=CFOCF_3$, $CF_2=CFOCF_2CF_2CF_2OCF_3$, $CF_2=CFOCF_2CF_2CF_3$, $CF_2=CFOCF_2CF(CF_3)OCF_2CF_2CF_3$, and $CF_2=CFOCF_2CF(CF_3)OCF_2CF(CF_3)OCF_2CF_2CF_3$.

Exemplary melt-processible copolymers of tetrafluoroethylene and other monomer(s) discussed above include those available as DYNEON THV 220, DYNEON THV 230, DYNEON THV 500, DYNEON THV 500G, DYNEON THV 510, DYNEON THV 510D, DYNEON THV 610, DYNEON THV 815, and DYNEON THVP 2030G from Dyneon LLC of Oakdale, Minn. Additional useful polymers are disclosed in U.S. Pat. No. 6,498,683 B2 (Condo et al.) and U.S. Pat. No. 6,352,761 B1 (Hebrink et al.).

Polymers used for forming optical layers of the UV-reflective optical layer stack typically have little or no absorbance at wavelengths above 350 nm, and desirably above 300 nm.

In general, at least the second and fourth polymers should be chosen so that in the respective optical layer stack, the refractive indexes of the second and fourth optical layers, in at least one direction, differ significantly from the index of refraction of the respective first and third optical layers in the same direction. Because polymeric materials are typically dispersive, that is, the refractive indices vary with wavelength, these conditions must be considered in terms of a particular spectral bandwidth of interest. It will be understood from the foregoing discussion that the choice of a second polymer is dependent not only on the intended application of the optical layer stack in question, but also on the choice made for the first polymer, as well as processing conditions.

The UV-reflective and/or VIS/IR multilayer optical films may optionally include one or more non-optical layers such as, for example, one or more skin layers or one or more interior non-optical layers, such as, for example, protective boundary layers between packets of optical layers. Non-optical layers can be used to give the multilayer optical film structure or to protect it from harm or damage during or after processing. For some applications, it may be desirable to include sacrificial protective skins, wherein the interfacial adhesion between the skin layer(s) and the optical layer stack is controlled so that the skin layers can be stripped from the optical layer stack before use.

Materials may be chosen for the non-optical layers that impart or improve properties such as, for example, tear resistance, puncture resistance, toughness, weatherability, and solvent resistance of the multilayer optical body. Typically, one or more of the non-optical layers are placed so that at least a portion of the light to be transmitted or reflected by optical layers also travels through these layers (i.e., these layers are placed in the path of light that travels through or is reflected by the first and second optical layers). The non-optical layers typically do not substantially affect the reflective properties of the broadband reflectors over the wavelength region of interest. Properties of the non-optical layers such as thermal expansion and shrinkage characteristics need to be considered along with the properties of the optical layers to give the film of the present invention that does not crack or wrinkle when laminated to severely curved substrates.

The non-optical layers may be of any appropriate material and can be the same as one of the materials used in the optical layer stack. Of course, it is important that the material chosen not have optical properties deleterious to those of the optical layer stack(s). For example, the non-optical layers should typically have little or no absorbance that would interfere with optical layer stack. The non-optical layers may be formed from a variety of polymers, such as polyesters, including any of the polymers used in the first and second optical layers. In some embodiments, the material selected for the non-optical layers is similar to or the same as the material selected for the second optical layers. The use of coPEN, coPET, or other copolymer material for skin layers reduces the breaking apart of multilayer optical film(s) due to strain-induced crystallinity and alignment of a majority of the polymer molecules in the direction of orientation.

Typically, the polymers of the first and second optical layers (and likewise the third and fourth optical layers), and the optional non-optical layers are chosen to have similar rheological properties (e.g., melt viscosities) so that they can be co-extruded without flow disturbances. Typically, the second and fourth optical layers, skin layers, and optional other non-optical layers have a glass transition temperature ($T_g$), that is either less than or equal to about 40° C. above the glass transition temperature of the respective first and third optical layers.

The optional non-optical layers can be thicker than, thinner than, or the same thickness as the various optical layers. The thickness of the optional non-optical layers is generally at least four times, typically at least 10 times, and can be at least 100 times, the thickness of at least one of the individual optical layers. The thickness of the non-optical layers can be varied to make a multilayer reflective film having a particular thickness. Optional non-optical layers may include one or more UV-absorbers and/or stabilizers. For example, they may contain extrusion compounded UVA absorbers such as those available as TINUVIN 1557 from Ciba Specialty Chemicals Corp., and extrusion compounded hindered amine light stabilizers (HALS) such as those available as CHIMASSORB 944 from Ciba Specialty Chemicals Corp.

Additional coatings may also be considered non-optical layers. Other layers include, for example, antistatic coatings or films; flame retardants; optical coatings; anti-fogging materials, etc.

The broadband reflectors can be fabricated by methods well-known to those of skill in the art by techniques such as for example, heat lamination and adhesive bonding. Exemplary useful adhesives (e.g., adhesive layer 120) that may be used in fabrication of broadband reflectors according to the present disclosure may be optically transparent and reasonably UV-light stable or not, and include: optically clear acrylic pressure sensitive adhesives (25 um thickness) available from 3M Company as OPTICALLY CLEAR LAMINATING ADHESIVE 8141 or as OPTICALLY CLEAR LAMINATING ADHESIVE 8171; tackified OTP adhesives as described in U.S. Pat. No. 7,371,464 B2 (Sherman et al.); and non-silicone pressure-sensitive adhesives as described in PCT Pat. Appln. No. PCT/US08/86596 entitled "Urea-Based Pressure Sensitive Adhesives", filed Dec. 12, 2008. In those applications wherein the adhesive is used as optional adhesive layer 125 or optional adhesive layer 225, then optical transparency and/or stability is typically not of significance as little if any light will reach the adhesive in typical constructions. Accordingly, optional adhesive layer 125 or 225 may comprise any adhesive composition such as e.g., an epoxy, urethane, silicone, or acrylic adhesive, or a combination thereof. The adhesive composition may comprise, for example, a pressure-sensitive adhesive, a thermosetting adhesive, a hot melt adhesive, or a combination thereof. Advantageously, broadband reflectors 100 and 200 may be adhesive bonded to existing solar reflector(s). This process is useful for retrofitting existing CSP installations.

Further considerations relating to the selection of materials, mode of operation, and manufacturing of multilayer optical films can be obtained with reference to U.S. Pat. No. 5,882,774 (Jonza et al.); U.S. Pat. No. 6,157,490 (Wheatley et al.); U.S. Pat. No. 6,207,260 B1 (Wheatley et al.); U.S. Pat. No. 6,783,349 B2 (Neavin et al.); U.S. Pat. No. 6,827,886 B2 (Neavin et al.); U.S. Pat. No. 6,179,948 B1 (Merrill et al.); U.S. Pat. No. 6,808,658 B2 (Stover); and U.S. Pat. No. 6,830,713 B2 (Hebrink et al.).

Broadband reflectors according the present disclosure may be planar or curved (e.g., parabolic or parabolic trough-shaped) and are typically in the form of a compliant sheet or film, although this is not a requirement. For example, they may be combined with a rigid member (e.g., a backing support) that imparts and retains a particular shape to the broadband reflector surface (e.g., a curved reflective surface). For purposes of the present disclosure, the term "compliant" is an indication that the broadband reflector is dimensionally stable yet possesses a pliable characteristic that enables subsequent molding or shaping into various forms. In some exemplary embodiments, broadband reflectors according to the present disclosure may be thermoformed into various shapes or structures for specific end use applications.

Broadband reflectors according to the present disclosure may be converted, for example, by thermoforming, vacuum forming, shaping, rolling, or pressure forming, into shapes and/or dimensions (e.g., curved surfaces and parabolic surfaces) conventionally used for reflectors such as, for example, solar concentrators used in concentrated solar power systems. Additionally, the broadband reflectors may be reinforced, for example, by injection cladding, corrugation, or addition of ribs, foam spacer layers, or honeycomb structures to improve its dimensional stability. One exemplary reinforcing material is twin wall polycarbonate sheeting, e.g., as available as SUNLITE MULTIWALL POLYCARBONATE SHEET from Palram Americas, Inc. of Kutztown, Pa. Thermoforming of multilayer optical films is generally described in U.S. Pat. No. 6,788,463 B2 (Merrill et al.).

Advantageously, broadband reflectors according to the present disclosure, especially if formed into solar concentrators, are capable of concentrating high levels of sunlight at a fraction of the weight of conventional solar concentrators.

Figure 3:
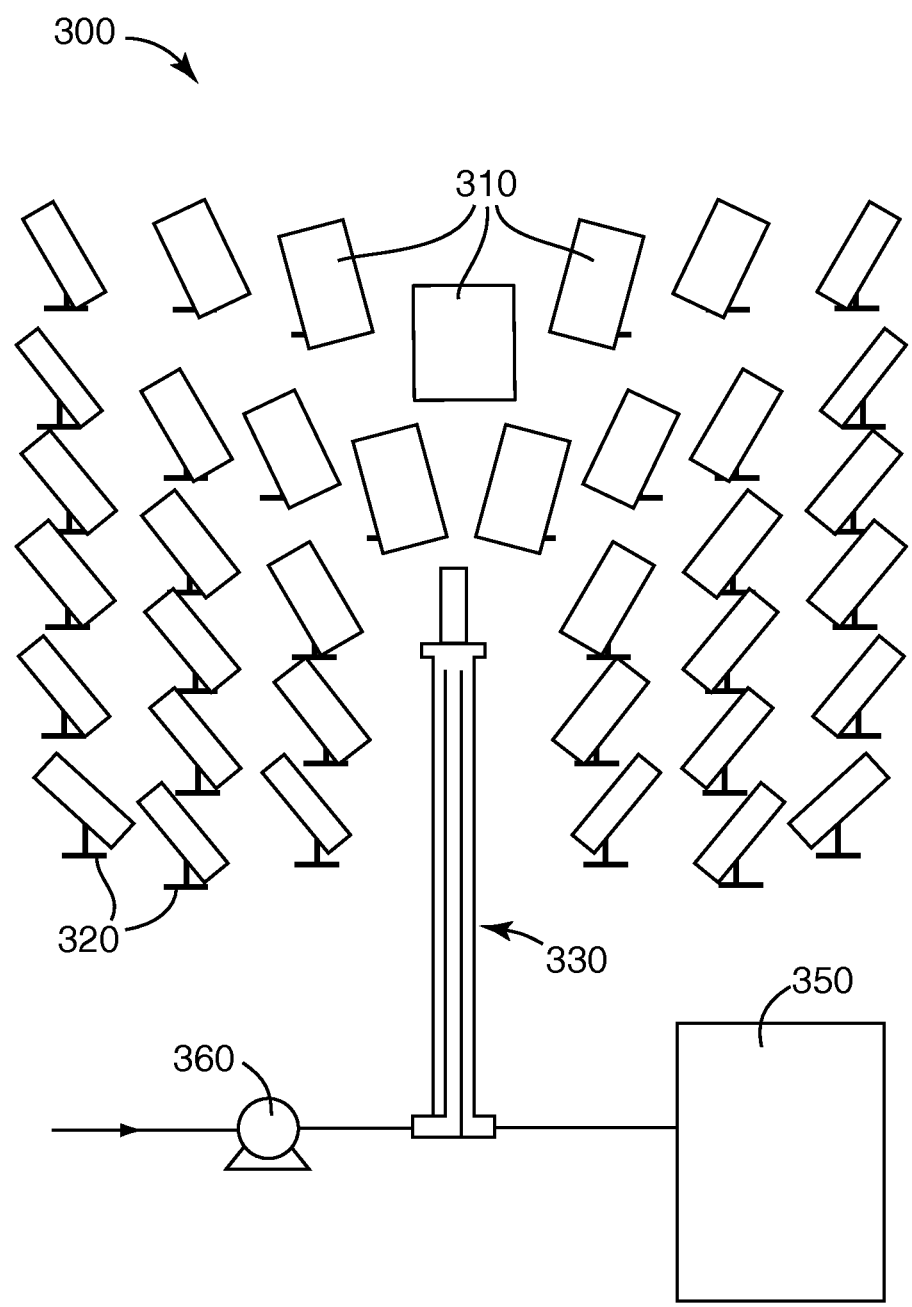
FIG. 3 is a schematic plan view of concentrated solar power system according to one embodiment of the present disclosure.

An exemplary concentrated solar power system 300 is depicted schematically in FIG. 3. Concentrated solar power system 300 comprises broadband reflectors 310 connected to celestial tracking mechanism 320 that is capable of aligning direct solar radiation from broadband reflectors 310 onto hollow receiver 330. A heat transfer fluid 340 circulates by means of pump 360 through the hollow receiver 330 where it is heated by concentrated solar radiation. The heated heat transfer fluid 340 is then directed to an electrical generator 350 (e.g., a steam turbine) when the thermal energy is converted to electrical energy. In another embodiment, the heat transfer fluid may be directed to a heat exchanger instead of the electrical generator, where the heat content is transferred to a liquid medium such as, for example, water that is converted to steam which drives the electrical generator.

Figure 4:
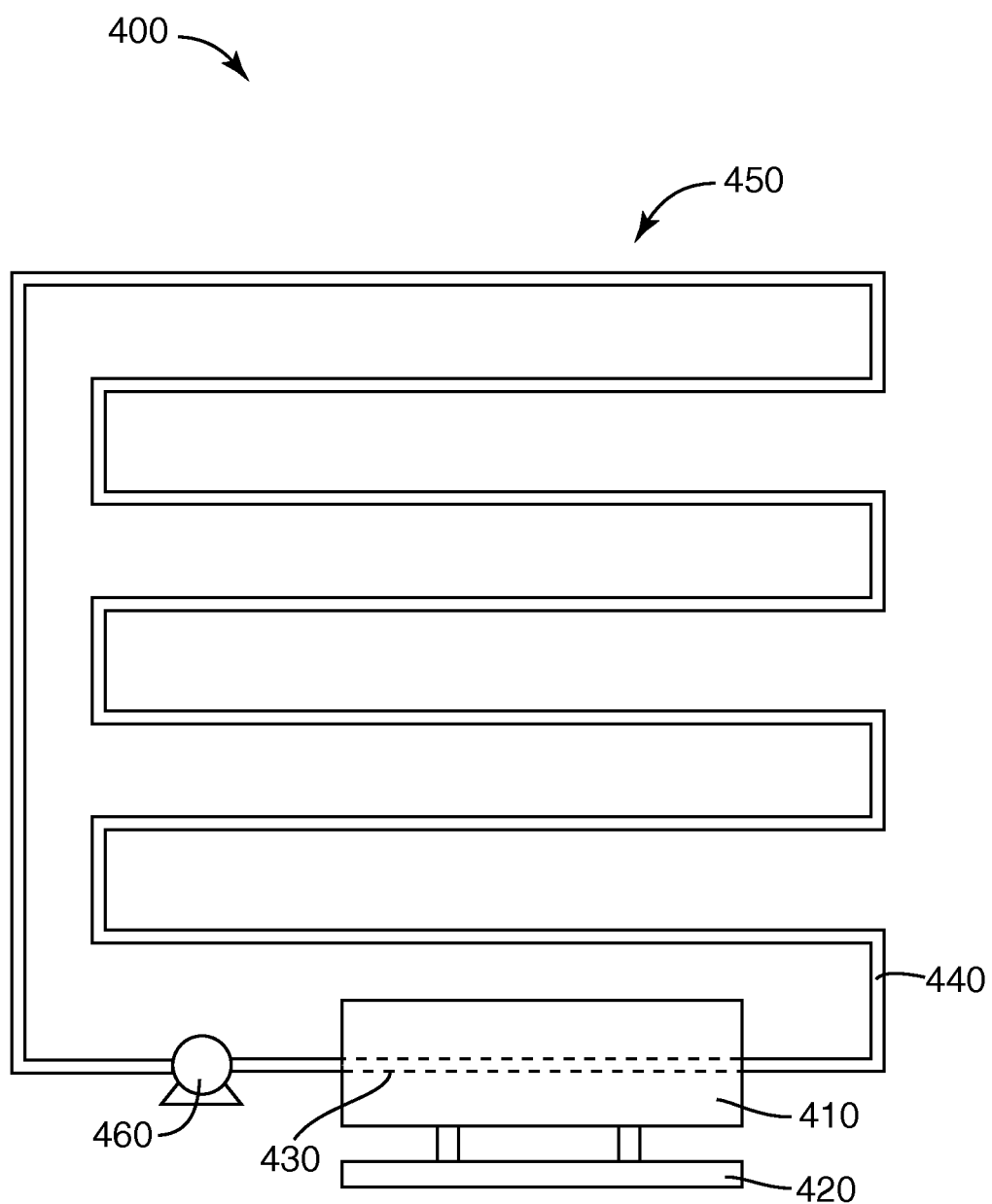
FIG. 4 is a schematic plan view of concentrated solar power system according to one embodiment of the present disclosure.

Another exemplary concentrated solar power system 400 is depicted schematically in FIG. 4. Concentrated solar power system 400 comprises parabolic trough-shaped broadband reflectors 410 connected to celestial tracking mechanism 420 that is capable of aligning direct solar radiation from broadband reflectors 410 onto hollow receiver 430. A heat transfer fluid 440 circulates by means of pump 460 through the hollow receiver 430 where it is heated by concentrated solar radiation. The heated heat transfer fluid 440 is then directed to a thermal heating system 450 where the thermal energy is converted to electrical energy.

The hollow receivers may be transparent or opaque and should typically be made of material (e.g., metal or glass) that is capable of withstanding the light and heat directed upon it by the broadband reflectors. Exemplary heat transfer fluids include water, water/glycol mixtures, brine, molten salts, and oils, with the selected typically being dictated by application requirements and cost. Often the hollow receivers comprise an interior pipe coated with a solar absorbing material disposed inside an exterior transparent (e.g., glass) pipe, although other configurations may also be used. In some embodiments, the heated heat transfer fluid flowing through the solar absorbing hollow receiver exchanges heat with water to create steam that drives an electric generator.

Further enhancements in the concentrated solar polar system output may be achieved when anti-reflective surface structured films or coatings are applied to the front surface of the hollow receiver. Surface structures in the films or coating typically change the angle of incidence of light such that it enters the polymer and hollow receiver beyond the critical angle and is internally reflected, leading to more absorption by the hollow receiver. Such surface structures can be in the shape, for example, of linear prisms, pyramids, cones, or columnar structures. For prisms, typically the apex angle of the prisms is less than 90 degrees (e.g., less than 60 degrees). The refractive index of the surface structured film or coating is typically less than 1.55 (e.g., less than 1.50). These anti-reflective surface structured films or coatings can be made durable and easily cleanable with the use of inherently UV stable and hydrophobic or hydrophilic materials. Anti-reflective coatings (e.g., nanostructured coatings or low refractive index coatings) could also be applied to the interior glass surface of the hollow receiver. Durability of the anti-reflective coatings or films can be enhanced with the addition of inorganic nano-particles.

Broadband reflectors according to the present disclosure may also be useful, for example, for concentrated photovoltaic systems. For example, a broadband reflector disclosed herein may be useful when placed in proximity to a multi junction GaAs cell, which has an absorption bandwidth from about 350 nm to about 1750 nm, or a mono-crystalline silicon photovoltaic cell having an absorption bandwidth of about 400 nm to about 1150 nm. In some embodiments, a thermal management device (e.g., in the form of ribs, pins, or fins) may be used to dissipate heat from the solar cell.

FIG. 7 shows a tracking device 700, which may be useful, for example, in the concentrated solar power system 400 shown in FIG. 4. Tracking device 700 comprises parabolic trough-shaped broadband reflectors 710 with hollow receiver 730 placed at the focal line. Two rods 770 extending outside the end pieces 712 of a trough-shaped broadband reflector 710 are used to connect the trough to a frame 720 and a crossbar 722, respectively, at each end of the assembly. The crossbar 722 can be connected to a driving mechanism. With a plurality of trough-shaped broadband reflectors 710 being pivotally positioned in a pair of parallel stationary frames, as shown in FIG. 7, the crossbars 722 to which each trough 710 is attached can, in some embodiments, simultaneously pivot all of the troughs about their axes. Thus, the orientation of all the trough-shaped broadband reflectors 710 can be collectively adjusted to follow the sun movement in unison. Although FIG. 7 shows two crossbars 722, one on each side of the trough 710, it is possible to use only one crossbar. In some embodiments of tracking device 700 shown in FIG. 7, the trough-shaped broadband reflector 710 is aligned in the east-west direction with a rotational freedom in the north-south direction typically not less than 10 degrees, 15 degrees, 20 degrees, or 25 degrees, for example, for adjustments to track the sun through seasonal variations (i.e., through the different paths between equinox and solstice). When the hollow receiver 730 is incorporated into a linear parabolic trough-shaped broadband reflector 710 tilted toward the south, the incident solar irradiance enters within the acceptance angle of the linear parabolic reflector. The aperture of the parabola determines how often the position of the trough-shaped broadband reflector 710 must be changed (e.g., hourly, daily, or less frequently). In some embodiments of tracking devices 700 shown in FIG. 7, the hollow receiver 730 is aligned in the north-south direction, and the rotational freedom in the east-west direction is typically not less than 90 degrees, 120 degrees, 160 degrees, or 180 degrees, for example, for tracking adjustments following the sun as it moves across the sky throughout the day.

In some of these embodiments, the frame can be mounted, for example, to a back board (not shown) for the solar collection device, which back board may comprise a mechanism for adjusting tilt to track the sun through seasonal variations (e.g., in the north-south direction). Although trough-shaped broadband reflectors 710 shown in FIG. 7, have parabolic shapes, other shapes may be used (e.g., hyperbolic, elliptical, tubular, or triangular). Additional celestial tracking mechanisms which allow the solar concentrating mirror and/or the solar cell to pivot in two directions and which may be useful for solar collection devices disclosed herein are described in U.S. Pat. App. Pub. No. 2007/0251569 (Shan et al.).

Figure 8B:
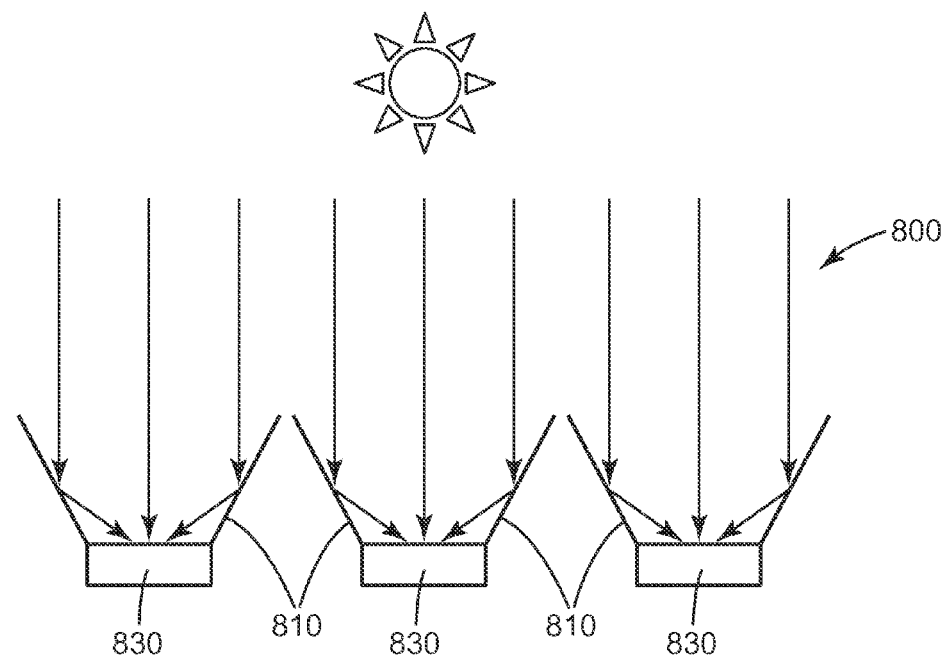
FIG. 8b is a diagram showing an embodiment of an array of hollow receivers with louvers comprising the broadband reflectors disclosed herein, wherein the louvers are oriented to enhance capture of rays from the mid-day sun.
Figure 8C:
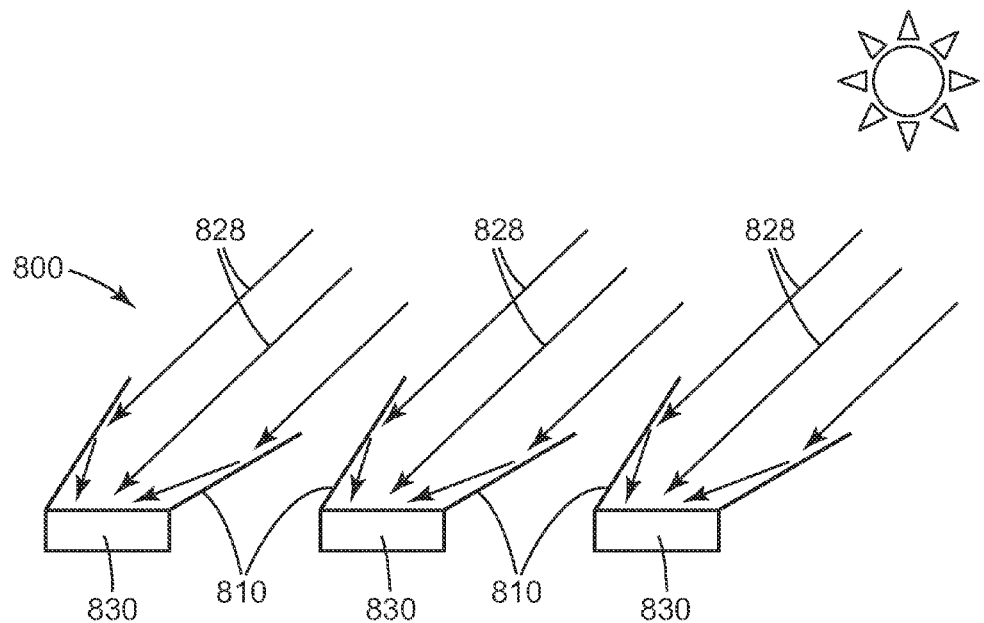
FIG. 8c is a diagram showing an embodiment of an array of hollow receivers with louvers comprising the broadband reflectors disclosed herein, wherein the louvers are oriented to enhance capture of rays from the evening sun.

Another embodiment of a tracking device useful for the concentrated solar power systems disclosed herein is illustrated in FIGS. 8*a*, 8*b*, and 8*c*. In this embodiment, array 800 comprises hollow receivers 830 and louvers 810 comprising the broadband reflector according to any of the embodiments disclosed herein pivotally mounted adjacent the hollow receivers. A louver can comprise, for example, the broadband reflector disclosed herein applied onto a substrate (e.g., a glass sheet, polymeric sheet, or polymer fiber composite) or a free-standing broadband reflector. In some embodiments, the louver comprises a broadband reflector disclosed herein laminated to a polymer sheet (e.g., PMMA). The louver may be directly attached to either side of the hollow receiver (e.g., with hinges) as shown in FIG. 8*a*, 8*b*, or 8*c*, or the louver may be pivotally mounted on a frame that also holds the hollow receiver. In some embodiments, two louvers are associated with (e.g., hinged to) each hollow receiver.

In FIGS. 8*a*, 8*b*, and 8*c*, the louvers 810 are oriented toward the morning, mid-day, and evening sun, respectively. The louvers 810 track the sun and enable increased capture of sunlight 828 by hollow receivers 830. As a result, typically fewer hollow receivers 830 are needed in an array 800. The array 800 shown in FIGS. 8*a* and 8*c* may be especially effective at increasing the capture of sunlight in the mornings and evenings. The louvers can move independently with rotational freedom (e.g., in the east-west direction) typically not less than 90 degrees, 120 degrees, 160 degrees, or 180 degrees, for example, for tracking adjustments following the sun as it moves across the sky throughout the day. Optionally, the array 800 can be mounted, for example, to one or more back boards (not shown), which may comprise a mechanism for adjusting tilt to track the sun through seasonal variations (e.g., in the north-south direction). The louvers may be planar, substantially planar, or curved in shape.

Solar thermal arrays 800 with louver solar trackers 810 can be made with a lower profile and lighter weight than solar thermal trackers. In some embodiments of array 800, hollow receivers 830 having widths of 1 inch (2.54 cm) or less can be used to minimize the depth profile of the array. Arrays could also be designed with larger hollow receivers (e.g., widths of 6-inch (15 cm), 12-inch (30.5 cm), 21-inch (53 cm), or higher). Thus, the arrays 800 can be designed to fit a number of applications including use on roof tops. Embodiments wherein the hollow receivers 830 are stationary and the louvers 810 are pivotally mounted may be advantageous (e.g., in design and/or cost) over tracking systems which require movement of the hollow receivers. Solar concentration can be adjusted, for example, with the size of the broadband reflector relative to the hollow receiver and the reflectors's angle relative to the hollow receiver to optimize the solar concentration ratio for a desired geographic location.

Movement of reflectors 710 shown in FIG. 7 or louvers 810 shown in FIGS. 8a, 8b, and 8c can be controlled by a number of mechanisms (e.g., piston driven levers, screw driven levers, pulley driven cables, and cam systems). Software can also be integrated with the tracking mechanism based on GPS coordinates to optimize the position of the mirrors. Feedback control loops based on solar absorber temperature can be used to maximize solar thermal energy generation.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight.

Preparation of Oxalylamidopropyl-Terminated Polydimethylsiloxane

Polydimethylsiloxanediamine (830.00 grams (g); 14,000 g/mole) was placed in a 2-liter, 3-neck resin flask equipped with a mechanical stirrer, heating mantle, nitrogen inlet tube (with stopcock), and an outlet tube. The flask was purged with nitrogen for 15 minutes and then, with vigorous stirring, diethyl oxalate (33.56 grams) was added dropwise. This reaction mixture was stirred for approximately one hour at room temperature and then for 75 minutes at 80° C. The reaction flask was fitted with a distillation adaptor and receiver. The reaction mixture was heated under vacuum (133 Pa) for 2 hours at 120° C., and then 30 minutes at 130° C. until no further distillate was able to be collected. The reaction mixture was cooled to room temperature. Gas chromatographic analysis of the clear, mobile liquid showed that no detectable level of diethyl oxalate remained. The ester equivalent weight was determined using $^1$H NMR (equivalent weight equal to 7,916 grams/equivalent) and by titration (equivalent weight equal to 8,272 grams/equivalent).

Preparation of OTP1

Into a 20° C. 10-gallon (37.85-Liter) stainless steel reaction vessel was placed 18158.4 grams of oxalylamidopropyl-terminated polydimethylsiloxane (titrated molecular weight=14,890 g/mole) that was prepared generally as in the Preparation of Oxalylamidopropyl-terminated Polydimethylsiloxane (above), but with the volumes adjusted accordingly. The vessel was subjected to agitation (75 revolutions per minute (rpm)), and purged with nitrogen flow and vacuum for 15 minutes. The kettle was then heated to 80° C. over the course of 25 minutes. Ethylenediamine (73.29 grams, GFS Chemicals) was vacuum charged into the kettle, followed by 73.29 grams of toluene (also vacuum charged). The kettle was then pressurized to one pound per square inch (7 kPa) applied pressure and heated to a temperature of 120° C. After 30 minutes, the kettle was heated at 150° C. Once a temperature of 150° C. was reached, the kettle was vented over the course of 5 minutes. The kettle was subjected to partial vacuum (approximately 65 mm Hg, 8.67 kPa) for 40 minutes to remove the ethanol and toluene. The kettle was then pressured to 2 pounds per square inch (14 kPa) applied pressure and the resultant viscous molten polymer was then drained into polytetrafluoroethylene coated trays and allowed to cool. The cooled silicone polyoxamide product, polydiorganosiloxane polyoxamide block copolymer OTP1, was then ground into fine pellets.

Example 1

A UV-reflective multilayer optical film was made with first optical layers created from polyethylene terephthalate available as EASTAPAK 7452 from Eastman Chemical of Kingsport, Tenn. (PET1) and second optical layers created from a copolymer of 75 weight percent methyl methacrylate and 25 weight percent ethyl acrylate (available from Ineos Acrylics, Inc. of Memphis, Tenn. as PERSPEX CP63) (coPMMA1). The PET1 and CoPMMA1 were coextruded through a multilayer polymer melt manifold to form a stack of 223 optical layers. The layer thickness profile (layer thickness values) of this UV reflector was adjusted to be approximately a linear profile with the first (thinnest) optical layers adjusted to have about a ¼ wave optical thickness (index times physical thickness) for 340 nanometers (nm) light and progressing to the thickest layers which were adjusted to be about ¼ wave thick optical thickness for 420 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to these optical layers, non-optical protective skin layers of PET1 (101 micrometers thickness each) were coextruded on either side of the optical stack. This multilayer coextruded melt stream was cast onto a chilled roll at 22 meters per minute creating a multilayer cast web approximately 1400 micrometers (55 mils) thick. The multilayer cast web was then heated in a tenter oven at 95° C. for about 10 seconds prior to being biaxially oriented to a draw ratio of 3.3×3.5. The oriented multilayer film was further heated at 225° C. for 10 seconds to increase crystallinity of the PET layers. The UV-reflective multilayer optical film (FILM 1) was measured with a spectrophotometer (LAMBDA 950 UV/VIS/NIR SPECTROPHOTOMETER from Perkin-Elmer, Inc. of Waltham, Mass.) to have an average reflectivity of 97.8 percent over a bandwidth of 340-420 nm. A 10 nm thick layer of alumina was vapor coated on one side of the film. A 110 nm thick layer of silver was vapor coated onto the alumina layer, and then a 20 nm thick layer of copper was vapor coated over the silver layer for improved corrosion resistance.

Figure 5:
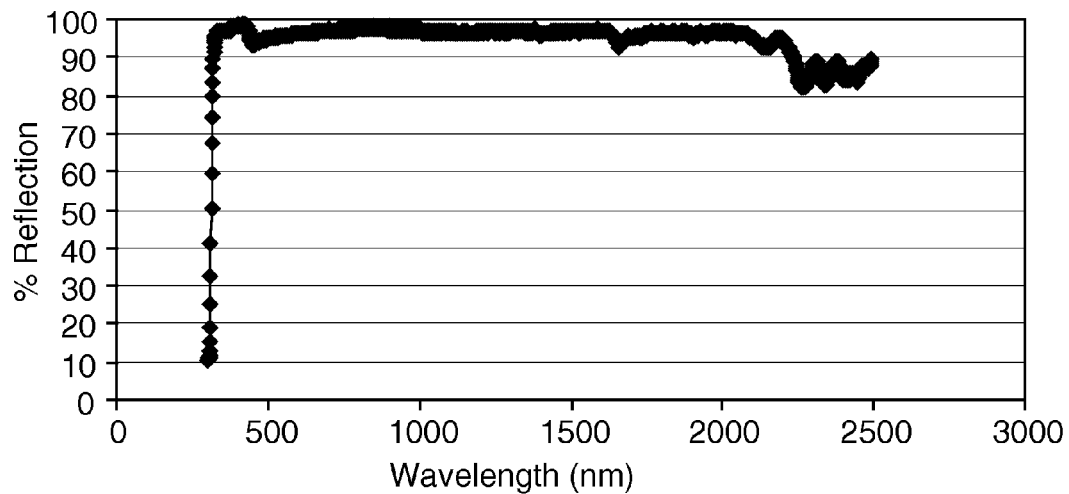
FIG. 5 is a plot of percent reflection versus wavelength for the broadband reflector of Example 1.

Average solar reflectivity (for light impinging the surface of the film opposite the copper layer) of the resultant film was measured and is reported in FIG. 5. Then the reflectance spectrum was weight averaged with the Standard Air Mass 1.5 Direct Normal and Hemispherical Spectral Solar Irradiance for 37° Sun-Facing Tilted Surface (according to ASTM G 173-03, updated March 2006 and entitled "Standard Tables for Reference Solar Spectral Irradiances: Direct Normal and Hemispherical on 37° Tilted Surface" resulting in a calculated 96.3 percent reflectivity over a bandwidth of from 300 nm to 2494 nm.

Example 2

A UV-reflective multilayer optical film was made with first optical layers created from PET1 and second optical layers created from CoPMMA1. PET1 and CoPMMA1 were coextruded through a multilayer polymer melt manifold to form 223 optical layers. The layer thickness profile (layer thickness values) of this UV reflector was adjusted to be approximately a linear profile with the first (thinnest) optical layers adjusted to have about a ¼ wave optical thickness (index times physical thickness) for 340 nm light and progressing to the thickest layers which were adjusted to be about ¼ wave thick optical thickness for 420 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to these optical layers, non-optical protective skin layers of PET1 with a thickness of 101 micrometers each were coextruded on either side of the optical stack. This multilayer coextruded melt stream was cast onto a chilled roll at 22 meters per minute creating a multilayer cast web approximately 1400 micrometers (55 mils) thick. The multilayer cast web was then heated in a tenter oven at 95° C. for about 10 seconds prior to being biaxially oriented to a draw ratio of 3.3×3.5. The oriented multilayer film was further heated at 225° C. for 10 seconds to increase crystallinity of the PET1 layers. The resultant UV-reflective multilayer optical film (FILM 1) was measured with a spectrophotometer (LAMBDA 950 UV/VIS/NIR SPECTROPHOTOMETER from Perkin-Elmer, Inc. of Waltham, Mass.) to have an average reflectivity of 97.8 percent over a bandwidth of 350-420 nm.

A VIS/IR-light reflective multilayer optical film was made with first optical layers created from PET1 and second optical layers created from CoPMMA1. PET1 and CoPMMA1 were coextruded through a multilayer polymer melt manifold to form 550 optical layers. In addition to these optical layers, non-optical protective skin layers of PET1(?) were coextruded on either side of the optical stack. This multilayer coextruded melt stream was cast onto a chilled roll at 22 meters per minute creating a multilayer cast web approximately 1400 micrometers (55 mils) thick. The multilayer cast web was then heated in a tenter oven at 95° C. for about 10 seconds prior to being biaxially oriented to a draw ratio of 3.8×3.8. The oriented multilayer film was further heated at 225° C. for 10 seconds to increase crystallinity of the PET1 layers. The resultant Vis/IR-light reflective multilayer optical film (FILM 2) was measured with a LAMBDA 950 UV/VIS/NIR spectrophotometer to have an average reflectivity of 97.1 percent over a bandwidth of 400-800 nm.

FILM 1 was laminated to FILM 2 with an acrylate-based optically clear pressure sensitive adhesive manufactured by 3M Company as OPTICALLY CLEAR LAMINATING ADHESIVE PSA 8141.

A 10 nm thick layer of alumina was then vacuum vapor coated onto the exposed surface of FILM 2. A 110 nm thick layer of silver was vacuum vapor coated onto the alumina layer, and then a 20 nm thick layer of copper was vacuum vapor coated over the silver layer for improved corrosion resistance.

Figure 6:
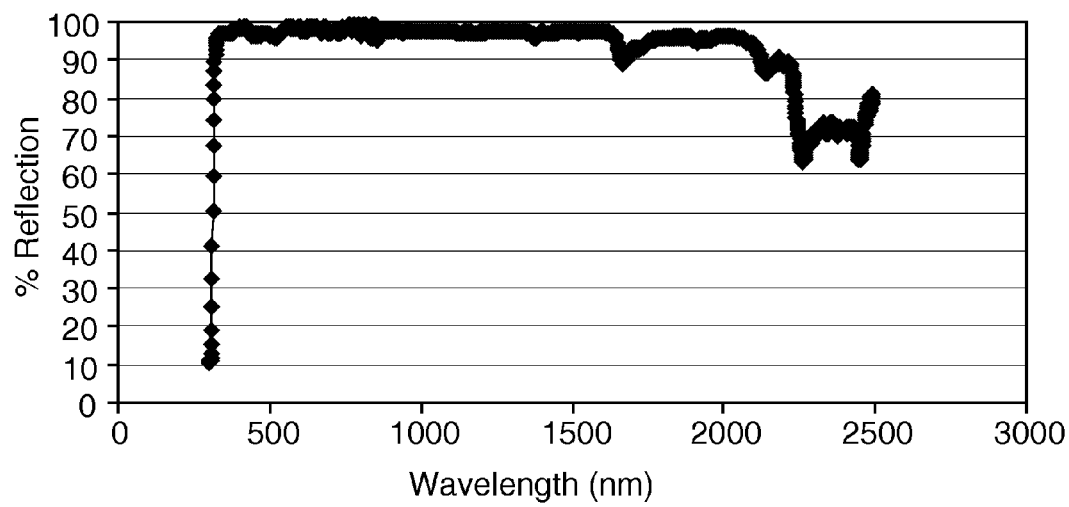
FIG. 6 is a plot of percent reflection versus wavelength for the broadband reflector of Example 2.

Average solar reflectivity (for light impinging the surface of the film opposite the copper layer) of the resultant film was measured and is reported in FIG. 6. Then the reflectance spectrum was weight averaged with the Standard Air Mass 1.5 Direct Normal and Hemispherical Spectral Solar Irradiance for 37° Sun-Facing Tilted Surface (according to ASTM G 173-03, updated March 2006 and entitled "Standard Tables for Reference Solar Spectral Irradiances: Direct Normal and Hemispherical on 37° Tilted Surface" resulting in a calculated 96.9 percent reflectivity over a bandwidth of from 300 nm to 2494 nm.

Example 3

A UV-reflective multilayer optical film was made with first optical layers created from PET1 and second optical layers created from CoPMMA1. PET1 and CoPMMA1 were coextruded through a multilayer polymer melt manifold to form 223 optical layers. The layer thickness profile (layer thickness values) of this UV reflector was adjusted to be approximately a linear profile with the first (thinnest) optical layers adjusted to have about a ¼ wave optical thickness (index times physical thickness) for 340 nm light and progressing to the thickest layers which were adjusted to be about ¼ wave thick optical thickness for 420 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to these optical layers, non-optical protective skin layers of PET1 of 101 micrometers thickness each were coextruded on either side of the optical stack. This multilayer coextruded melt stream was cast onto a chilled roll at 22 meters per minute creating a multilayer cast web approximately 1400 micrometers (55 mils) thick. The multilayer cast web was then heated in a tenter oven at 95° C. for about 10 seconds prior to being biaxially oriented to a draw ratio of 3.3×3.5. The oriented multilayer film was further heated at 225° C. for 10 seconds to increase crystallinity of the PET1 layers. The resultant UV-reflective multilayer optical film (FILM 1) was measured with a LAMBDA 950 UV/VIS/NIR spectrophotometer to have an average reflectivity of 97.8 percent over a bandwidth of 340-420 nm.

A VIS/IR-reflective multilayer optical film was made with first optical layers created from polyethylene 2,6-naphthalate (PEN1) and second optical layers created from PMMA1 (an acrylic resin available under the trade designation V044 Acrylic Resin from Arkema, Inc.). PEN1 and PMMA1 were coextruded through a multilayer polymer melt manifold to form 275 optical layers. In addition to these optical layers, non-optical protective skin layers of PEN1 were coextruded on either side of the optical stack. This multilayer coextruded melt stream was cast onto a chilled roll at 22 meters per minute creating a multilayer cast web approximately 1400 micrometers (55 mils) thick. The multilayer cast web was then heated in a tenter oven at 140° C. for about 10 seconds prior to being biaxially oriented to a draw ratio of 3.8×3.8. The oriented multilayer film was further heated at 235° C. for 10 seconds to increase crystallinity of the PEN1 layers. The resultant VIS/IR-reflective multilayer optical film (FILM 3) was measured with a LAMBDA 950 UV/VIS/NIR spectrophotometer to have an average reflectivity of 98.6 percent over a bandwidth of 400-900 nm.

Film 1 was laminated to Film 3 with an acrylate based optically clear pressure sensitive adhesive manufactured by 3M Company as OPTICALLY CLEAR LAMINATING PSA 8141.

A 10 nm thick layer of alumina was then vacuum vapor coated onto the exposed surface of FILM 3. A110 nm thick layer of silver was vacuum vapor coated onto the alumina layer, and then a 20 nm thick layer of copper was vacuum vapor coated over the silver layer for improved corrosion resistance.

Average solar reflectivity of this film was measured and then weight averaged with the Standard Air Mass 1.5 Direct Normal and Hemispherical Spectral Solar Irradiance for 37° Sun-Facing Tilted Surface (according to ASTM G 173-03, updated March 2006 and entitled "Standard Tables for Reference Solar Spectral Irradiances: Direct Normal and Hemispherical on 37° Tilted Surface" to be 97.7 percent over a bandwidth of 300 nm to 2494 nm.

Prophetic Example 1

A UV/Vis-reflective multilayer optical film would be made with first optical layers created from PET (polyethylene terephthalate) available as EASTAPAK 7452 from Eastman Chemical and second optical layers created from OTP1. PET and OTP1 would be coextruded thru a multilayer polymer melt manifold to create a multilayer melt stream having 550 alternating first and second optical layers. The layer thickness profile (layer thickness values) of this UV reflector would be adjusted to be approximately a linear profile with the first (thinnest) optical layers adjusted to have about a ¼ wave optical thickness (index times physical thickness) for 350 nm light and progressing to the thickest layers which would be adjusted to be about ¼ wave thick optical thickness for 800 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of non-optical layers consisting of PET loaded with 2 weight percent of a UV-absorber available as TINUVIN 1577 from Ciba Specialty Chemicals Corp. would be coextrusion coated as a protective skin layer on either side of the UV-reflective multilayer optical film. This multilayer coextruded melt stream would be cast onto a chilled roll at 22 meters per minute creating a multilayer cast web approximately 1400 micrometers (55 mils) thick. The multilayer cast web would be then heated in a tenter oven at 95° C. for 10 seconds prior to being biaxially oriented to a draw ratio of 3.3×3.5. The oriented multilayer film would be further heated at 225° C. for 10 seconds to increase crystallinity of the PET layers resulting in Film 4. A 10 nm thick layer of alumina would then be vacuum vapor coated onto the exposed surface of FILM 4. A 110 nm thick layer of silver would then be vacuum vapor coated onto the alumina layer, and then a 20 nm thick layer of copper would then be vacuum vapor coated over the silver layer for improved corrosion resistance An acrylic resin available under the trade designation V044 Acrylic Resin from Arkema, Inc. of Philadelphia, Pa., would be extrusion compounded with 3 weight percent of a UV-absorber available as TINUVIN 1577 from Ciba Specialty Chemicals Corp., and 0.15 weight percent of a hindered amine light stabilizer available as CHIMASSORB 944 from Ciba Specialty Chemicals Corp., and an anhydride-modified ethylene vinyl acetate polymer adhesive available as BYNEL E418 from E. I. du Pont de Nemours and Co. of Wilmington, Del., and then coextrusion coated as a tie layer onto FILM 4 opposite the metallic layer and simultaneously directed into a nip under a pressure of 893 kg/m (50 pounds per lineal inch) against a casting tool having a reflector finish surface at a temperature of 90° F. (32° C.), at a casting line speed of 0.38 meters per second (75 feet per minute) to produce FILM 5. The coextrusion coated layers would have a total thickness of 150 micrometers (6 mils) with a skin:tie layer thickness ratio of 20:1. The same materials could also be coextrusion coated onto the opposite surface of FILM 5.

A scratch resistant coating consisting of a thermally cured siliceous polymer available as PERMA-NEW 6000 CLEAR HARD COATING SOLUTION from California Hardcoating Co. of Chula Vista, Calif. would be coated on top of the acrylic resin skin layer.

Prophetic Example 2

A multilayer reflective reflector would be made with first optical layers created from PET and second optical layers created from a terpolymer of tetrafluoroethylene, hexafluoropropylene and vinylidene fluoride available as THV 2030 from Dyneon, LLC, Oakdale, Minn. PET and THV 2030 copolymer would be coextruded thru a multilayer polymer melt manifold to create a multilayer melt stream having 550 alternating first and second optical layers. The layer thickness profile (layer thickness values) of this UV-Vis reflector would be adjusted to be approximately a linear profile with the first (thinnest) optical layers adjusted to have about a ¼ wave optical thickness (index times physical thickness) for 340 nm light and progressing to the thickest layers which would be adjusted to be about ¼ wave thick optical thickness for 1100 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of non-optical layers also comprised of PET loaded with 2 weight percent of UV-absorber available as TINUVIN 1577 from Ciba Specialty Chemicals Corp. would be coextruded as protective skin layers on either side of the optical layer stack. This multilayer coextruded melt stream would be cast onto a chilled roll at 22 meters per minute creating a multilayer cast web approximately 1400 micrometers (55 mils) in thickness. The multilayer cast web would then be heated in a tenter oven at 95° C. for 10 seconds prior to being biaxially oriented to a draw ratio of 3.3×3.5. The oriented multilayer film would then be further heated to 225° C. for 10 seconds to increase crystallinity of the PET layers resulting in FILM 6. A 10 nm thick layer of titania would then vacuum vapor coated onto the exposed surface of FILM 6. A silver layer having a 110 nm thickness would be vapor coated onto the tie layer. A copper layer (20 nm thickness) would then also be vapor coated onto the silver layer to protect it from corrosion.

An acrylic resin available under the trade designation V044 Acrylic Resin from Arkema, Inc. of Philadelphia, Pa. would be extrusion compounded with 3 weight percent of a UV-absorber available as TINUVIN 1577 from Ciba Specialty Chemicals Corp., and 0.15 weight percent of a hindered amine light stabilizer available as CHIMASSORB 944 from Ciba Specialty Chemicals Corp., and an anhydride-modified ethylene vinyl acetate polymer adhesive available as BYNEL E418 from E. I. du Pont de Nemours and Co. of Wilmington, Del., and then coextrusion coated as a tie layer onto FILM 6 opposite the metallic layer and simultaneously directed into a nip under a pressure of 893 kg/m (50 pounds per lineal inch) against a casting tool having a reflector finish surface at a temperature of 90° F. (32° C.), at a casting line speed of 0.38 meters per second (75 feet per minute) to produce FILM 7. The coextrusion coated layers would have a total thickness of 150 micrometers (6 mils) with a skin:tie layer thickness ratio of 20:1. The same materials would be coextrusion coated onto the opposing surface of the multilayer visible reflector film.

Prophetic Example 3

A copper layer (150 nm thickness) would be vapor coated onto one side of FILM 1 as described in Example 1.

An acrylic resin available under the trade designation V044 Acrylic Resin from Arkema, Inc. would be extrusion compounded with 3 weight percent of a UV-absorber available as TINUVIN 1577 from Ciba Specialty Chemicals Corp., and 0.15 weight percent of a hindered amine light stabilizer available as CHIMASSORB 944 from Ciba Specialty Chemicals Corp., and an anhydride-modified ethylene vinyl acetate polymer adhesive available as BYNEL E418 from E. I. du Pont de Nemours and Co., Wilmington, Del., and then coextrusion coated as a tie layer onto FILM 1 opposite the metallic layer and simultaneously directed into a nip under a pressure of 893 kg/m (50 pounds per lineal inch) against a casting tool having a reflector finish surface at a temperature of 90° F. (32° C.), at a casting line speed of 0.38 meters per second (75 feet per minute) resulting in FILM 8. The coextrusion coated layers would have a total thickness of 150 micrometers (6 mils) with a skin:tie layer thickness ratio of 20:1. The same materials would be coextrusion coated onto the opposite surface of Film 8.

A scratch resistant coating consisting of a thermally cured siliceous polymer available as PERMA-NEW 6000 CLEAR HARD COATING SOLUTION from California Hardcoating Co. would be coated on top of the acrylic resin skin layer.

Prophetic Example 4

A multilayer reflective reflector would be made with first optical layers created from polyethylene 2,6-naphthalate (PEN1) and second optical layers created from a terpolymer of tetrafluoroethylene, hexafluoropropylene and vinylidene fluoride available as THVP 2030G from Dyneon, LLC, Oakdale, Minn. (THV1). PEN1 and THV1 would be coextruded thru a multilayer polymer melt manifold to create a multilayer melt stream having 550 alternating first and second optical layers. The layer thickness profile (layer thickness values) of this Vis-IR reflector would be adjusted to be approximately a linear profile with the first (thinnest) optical layers adjusted to have about a ¼ wave optical thickness (index times physical thickness) for 420 nm light and progressing to the thickest layers which would be adjusted to be about ¼ wave thick optical thickness for 2500 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of non-optical layers also comprised of PEN loaded with 2 weight percent of UV-absorber available as TINUVIN 1577 from Ciba Specialty Chemicals Corp. would be coextruded as protective skin layers on either side of the optical layer stack. This multilayer coextruded melt stream would be cast onto a chilled roll at 22 meters per minute creating a multilayer cast web approximately 1400 micrometers (55 mils) thick. The multilayer cast web would then be heated in a tenter oven at 145° C. for 10 seconds prior to being biaxially oriented to a draw ratio of 3.8×3.8. The oriented multilayer film would then be further heated to 225° C. for 10 seconds to increase crystallinity of the PENT layers resulting in FILM 9.

The resultant VIS/IR-reflective multiplayer optical film would be laminated to, or coextruded with, a UV-reflective multiplayer optical film made with first optical layers created from PMMA1 available under the trade designation V044 Acrylic Resin from Arkema, Inc. and second optical layers created from a copolymer of tetrafluoroethylene available as THVP 2030 (THV1) from Dyneon, LLC. PMMA1 and THV1 would be coextruded through a multilayer polymer melt manifold to create a multilayer melt stream having 550 alternating first and second optical layers. The layer thickness profile (layer thickness values) of this UV reflector would be adjusted to be approximately a linear profile with the first (thinnest) optical layers adjusted to have about a ¼ wave optical thickness (index times physical thickness) for 340 nm light and progressing to the thickest layers which would be adjusted to be about ¼ wave thick optical thickness for 420 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of PMMA1 non-optical layers would be coextruded as protective skin layers on either side of the optical layer stack. These PMMA1 skin layers would be extrusion compounded with 2 weight percent of a UV absorber available as TINUVIN 1577 and 0.15 percent CHIMMASORB 944 from Ciba Specialty Chemicals Corp. This multilayer coextruded melt stream would be cast onto a chilled roll at 22 meters per minute creating a multilayer cast web approximately 300 micrometers (12 mils) thick. The multilayer cast web would then be heated in a tenter oven at 135° C. for 10 seconds prior to being biaxially oriented to a draw ratio of 3.8×3.8. The resultant UV-reflective multilayer optical FILM 10 would then be extrusion hot melt laminated to the VIS/IR-reflective multilayer optical film with a hot melt adhesive available as ADMER SE810 from Mitsui Chemicals Americas, Inc. of Rye Brook, N.Y.

A scratch resistant coating consisting of a thermally cured siliceous polymer available as PERMA-NEW 6000 CLEAR HARD COATING SOLUTION from California Hardcoating Co. of Chula Vista, Calif. would be coated on top of the acrylic resin skin layer.

Prophetic Example 5

A broadband reflector film would be made with first optical layers created from PET1 and second optical layers created from OTP1. PET1 and OTP1 would be coextruded thru a multilayer polymer melt manifold to create a multilayer melt stream having 550 alternating first and second optical layers. The layer thickness profile (layer thickness values) of this Vis-IR reflector would be adjusted to be approximately a linear profile with the first (thinnest) optical layers adjusted to have about a ¼ wave optical thickness (index times physical thickness) for 420 nm light and progressing to the thickest layers which would be adjusted to be about ¼ wave thick optical thickness for 1100 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of non-optical layers consisting of PET1 loaded with 2 weight percent of a UV-absorber available as TINUVIN 1577 from Ciba Specialty Chemicals Corp. would be coextrusion coated as a protective skin layer on either side of the UV-reflective multilayer optical film. This multilayer coextruded melt stream would be cast onto a chilled roll at 22 meters per minute creating a multilayer cast web approximately 1400 micrometers (56 mils) thick. The multilayer cast web would be then heated in a tenter oven at 95° C. for 10 seconds prior to being biaxially oriented to a draw ratio of 3.3×3.5. The oriented multilayer film would be further heated at 225° C. for 10 seconds to increase crystallinity of the PET layers resulting in Film 4.

An acrylic resin available under the trade designation V044 Acrylic Resin from Arkema, Inc. would be extrusion compounded with 5 weight percent of a UV-absorber available as TINUVIN 1577 from Ciba Specialty Chemicals Corp., and 0.15 weight percent of a hindered amine light stabilizer available as CHIMASSORB 944 from Ciba Specialty Chemicals Corp., and an anhydride-modified ethylene vinyl acetate polymer adhesive available as BYNEL E418 from E. I. du Pont de Nemours and Co., and then coextrusion coated as a tie layer onto FILM 4 and simultaneously directed into a nip under a pressure of 893 kg/m (50 pounds per lineal inch) against a casting tool having a reflector finish surface at a temperature of 90° F. (32° C.), at line speed of 0.38 meters per second (75 feet per minute). The coextrusion coated layers would have a total thickness of 150 micrometers (6 mils) with skin:tie layer thickness ratio of 20:1. The same materials would be coextrusion coated onto the opposing surface of FILM 4. The resultant film would be laminated to or coextruded with a UV-reflective multilayer optical film made with first optical layers created from PMMA1 and second optical layers created from THV1 coextruded thru a multilayer polymer melt manifold to create a multilayer melt stream having 550 alternating first and second optical layers. The layer thickness profile (layer thickness values) of this UV reflector would be adjusted to be approximately a linear profile with the first (thinnest) optical layers adjusted to have about a ¼ wave optical thickness (index times physical thickness) for 340 nm light and progressing to the thickest layers which would be adjusted to be about ¼ wave thick optical thickness for 420 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of non-optical layers comprised of PMMA1 would be coextruded as protective skin layers on either side of the optical layer stack. These PMMA1 skins layers would be extrusion compounded with 2 weight percent of a UV absorber available as TINUVIN 1577 from Ciba Specialty Chemicals Corp. This multilayer coextruded melt stream would be cast onto a chilled roll at 22 meters per minute creating a multilayer cast web approximately 300 micrometers (12 mils) thick. The multilayer cast web would then be heated in a tenter oven at 135° C. for 10 seconds prior to being biaxially oriented to a draw ratio of 3.8×3.8.

A scratch resistant coating consisting of a thermally cured siliceous polymer available as PERMA-NEW 6000 CLEAR HARD COATING SOLUTION from California Hardcoating Co. would be coated on top of the acrylic resin skin layer.

Prophetic Example 6

A highly reflective broadband reflector would be made as in Prophetic Example 1, but rather than including the sequential silver/copper vapor coated metal layer, the broadband reflector film would be laminated to a sheet of polished anodized aluminum.

Prophetic Example 7

A highly reflective broadband reflector would be made as in Example 2, but rather than including the sequential silver/copper vapor coated metal layer, the broadband reflector film would be laminated to a sheet of polished stainless steel.

Prophetic Example 8

A multilayer optical film UV reflective reflector would be made with first optical layers created from PMMA1 (an acrylic resin available under the trade designation V044 Acrylic Resin from Arkema, Inc.) and second optical layers created from a terpolymer of tetrafluoroethylene, hexafluoropropylene and vinylidene fluoride available as THV 2030 from Dyneon, LLC. The PMMA and THV would be coextruded thru a multilayer polymer melt manifold to create a multilayer melt stream having 550 alternating first and second optical layers. The layer thickness profile (layer thickness values) of this UV reflector would be adjusted to be approximately a linear profile with the first (thinnest) optical layers adjusted to have about a ¼ wave optical thickness (index times physical thickness) for 340 nm light and progressing to the thickest layers which would be adjusted to be about ¼ wave thick optical thickness for 420 nm light. Layer thickness profiles of such films can be adjusted to provide for improved spectral characteristics using the axial rod apparatus taught in U.S. Pat. No. 6,783,349 (Neavin et al.) combined with layer profile information obtained with microscopic techniques.

In addition to the first and second optical layers, a pair of non-optical layers also comprised of PMMA1 would be coextruded as protective skin layers on either side of the optical layer stack. These PMMA1 skins layers would be extrusion compounded with 2 weight percent of a UV-absorber available as TINUVIN 1577 from Ciba Specialty Chemicals Corp. This multilayer coextruded melt stream would be cast onto a chilled roll at 22 meters per minute creating a multilayer cast web approximately 300 micrometers (12 mils) thick. The multilayer cast web would then be heated in a tenter oven at 135° C. for 10 seconds prior to being biaxially oriented to a draw ratio of 3.8×3.8 resulting in FILM 10.

A titanium dioxide tie layer having a 10 nm thickness would be vapor coated onto one side of FILM 10.

A silver layer having a 110 nm thickness would be vapor coated onto the tie layer. A copper layer, 20 nm thickness, would then also be vapor coated onto the silver to protect it from corrosion.

A scratch resistant coating consisting of a thermally cured siliceous polymer available as PERMA-NEW 6000 CLEAR HARD COATING SOLUTION from California Hardcoating Co. would be coated on top of the acrylic resin skin layer.

Prophetic Example 9

Film 11

A UV-VIS reflective multilayer optical film was made with first optical layers created from polyethylene terephthalate available as EASTAPAK 7452 from Eastman Chemical of Kingsport, Tenn., (PET1) and second optical layers created from a copolymer of 75 weight percent methyl methacrylate and 25 weight percent ethyl acrylate (available from Ineos Acrylics, Inc. of Memphis, Tenn., as PERSPEX CP63) (coPMMA1). The PET1 and CoPMMA1 were coextruded through a multilayer polymer melt manifold to form a stack of 550 optical layers. The layer thickness profile (layer thickness values) of this UV reflector was adjusted to be approximately a linear profile with the first (thinnest)

optical layers adjusted to have about a ¼ wave optical thickness (index times physical thickness) for 370 nm light and progressing to the thickest layers which were adjusted to be about ¼ wave thick optical thickness for 800 nm light. Layer thickness profiles of such films were adjusted to provide for improved spectral characteristics using the axial rod apparatus taught in U.S. Pat. No. 6,783,349 (Neavin et al.) combined with layer profile information obtained with microscopic techniques.

In addition to these optical layers, non-optical protective skin layers of PET1 (260 micrometers thickness each) were coextruded on either side of the optical stack. This multilayer coextruded melt stream was cast onto a chilled roll at 5.4 meters per minute creating a multilayer cast web approximately 1100 micrometers (43.9 mils) thick. The multilayer cast web was then preheated for about 10 seconds at 95° C. and uniaxially oriented in the machine direction at a draw ratio of 3.3:1. The multilayer cast web was then heated in a tenter oven at 95° C. for about 10 seconds prior to being uniaxially oriented in the transverse direction to a draw ratio of 3.5:1. The oriented multilayer film was further heated at 225° C. for 10 seconds to increase crystallinity of the PET layers. The UV-reflective multilayer optical film (Film 11) was measured with a spectrophotometer (LAMBDA 950 UV/VIS/NIR SPECTROPHOTOMETER from Perkin-Elmer, Inc. of Waltham, Mass.) to have an average reflectivity of 96.8 percent over a bandwidth of 370-800 nm.

Film 12

A near infra-red reflective multilayer optical film was made with first optical layers created from PET1 and second optical layers created from coPMMA1. The PET1 and CoPMMA1 were coextruded through a multilayer polymer melt manifold to form a stack of 550 optical layers. The layer thickness profile (layer thickness values) of this near infra-red reflector was adjusted to be approximately a linear profile with the first (thinnest) optical layers adjusted to have about a ¼ wave optical thickness (index times physical thickness) for 750 nm light and progressing to the thickest layers which were adjusted to be about ¼ wave thick optical thickness for 1350 nm light. Layer thickness profiles of such films were adjusted to provide for improved spectral characteristics using the axial rod apparatus taught in U.S. Pat. No. 6,783,349 (Neavin et al.) combined with layer profile information obtained with microscopic techniques.

In addition to these optical layers, non-optical protective skin layers of PET1 (260 micrometers thickness each) were coextruded on either side of the optical stack. This multilayer coextruded melt stream was cast onto a chilled roll at 3.23 meters per minute creating a multilayer cast web approximately 1800 micrometers (73 mils) thick. The multilayer cast web was then preheated for about 10 seconds at 95° C. and uniaxially oriented in the machine direction at a draw ratio of 3.3:1. The multilayer cast web was then heated in a tenter oven at 95° C. for about 10 seconds prior to being uniaxially oriented in the transverse direction to a draw ratio of 3.5:1. The oriented multilayer film was further heated at 225° C. for 10 seconds to increase crystallinity of the PET layers. The IR-reflective multilayer optical film (Film 12) was measured with a spectrophotometer (LAMBDA 950 UV/VIS/NIR SPECTROPHOTOMETER from Perkin-Elmer, Inc. of Waltham, Mass.) to have an average reflectivity of 96.1 percent over a bandwidth of 750-1350 nm.

A 10 nm thick layer of alumina would then be vacuum vapor coated onto the exposed surface of FILM 12. A 110 nm thick layer of silver could then be vacuum vapor coated onto the alumina layer, and then a 20 nm thick layer of copper was vacuum vapor coated over the silver layer for improved corrosion resistance.

Average solar reflectivity of this film would be expected to be 97 percent over a bandwidth of 300 nm to 2494 nm when measured and then weight averaged with the Standard Air Mass 1.5 Direct Normal and Hemispherical Spectral Solar Irradiance for 37° Sun-Facing Tilted Surface (according to ASTM G 173-03, updated March 2006 and entitled "Standard Tables for Reference Solar Spectral Irradiances: Direct Normal and Hemispherical on 37° Tilted Surface".

Illustrative Example

Film 11 and Film 12 were laminated together using an optically clear adhesive obtained from 3M Company, St. Paul, Minn., as OPTICALLY CLEAR LAMINATING ADHESIVE PSA 8171 and then laminated again to a 0.25" thick sheet of PMMA obtained from Arkema, Inc. under the trade designation PLEXIGLAS V044. The resulting mirror laminate plates were then attached to the sides of an 80 watt crystalline silicon photovoltaic module (available under the trade designation SHARP 80W) with added hinges which allowed tracking of the sun as shown in FIGS. 8a-c.

Photovoltaic module power output was measured with a handheld voltage/current meter and calculated by multiplying open circuit voltage with closed loop current, and then multiplication again by a fill factor of 0.75, with the assumption that the fill factor was not changed by the concentrating mirrors. Temperature measurements were made both by taping multiple thermocouples to the backside of the PV module, and with the use of an infra-red pyrometer. Power output increases over a non-concentrated solar control photovoltaic module were measured as high as 400% in the mornings when the sun was low in the sky and 40% during mid-day. Measurements were made for several days in April of 2009 in Scandia, Minn., USA which is in a northern latitude and has a temperate climate. Considerable variability was observed when any clouds or haze occurred in the sky so averaging of the data was done. Power measurement results are shown in Table 1, below. The temperatures of the photovoltaic modules did not exceed 85° C.

A UV-absorbing layer could be incorporated between Film 11 and Film 12 using the method of Prophetic Example 4, above, or on top of Film 11. The trend in the power output observed in Table 1 would not be expected to substantially change with the addition of the UV-absorbing layer.

TABLE 1

| Time of Day | Control *Power(watts) | Example 11 *Power(watts) | % increase |
|---|---|---|---|
| 8 AM | 15.4 | 76.3 | 396.1 |
| 9 AM | 36.9 | 104.9 | 184.4 |
| 10 AM | 57.8 | 114.8 | 98.7 |
| 11 AM | 77.2 | 120.8 | 56.6 |
| 12 PM | 80.4 | 113.2 | 40.8 |
| 1 PM | 80.9 | 110.0 | 35.9 |
| 2 PM | 74.2 | 108.4 | 46.1 |
| 3 PM | 68.2 | 106.6 | 56.3 |
| 4 PM | 58.0 | 108.1 | 86.4 |
| 5 PM | 32.3 | 105.0 | 225.6 |
| 6 PM | 16.9 | 79.8 | 372.9 |
| Sum= | 549 | 962.9 | 75.4 |

*assumes fill factor of .75

Although this Illustrative Example illustrates the increase in power out of a photovoltaic module, it is expected that a similar relative increase in power would occur from a solar thermal panel.

All patents and publications referred to herein are hereby incorporated by reference in their entirety. Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. A broadband reflector comprising:
    a UV-reflective multilayer optical film having a first major surface and comprising a UV-reflective optical layer stack, wherein the UV-reflective optical layer stack comprises first optical layers and second optical layers, wherein at least a portion of the first optical layers and at least a portion of the second optical layers are in intimate contact and have different refractive indexes, wherein the first optical layers comprise a first polymer and the second optical layers comprise a second polymer, and wherein neither the first polymer nor the second polymer absorb UV light in a wavelength range from 350 nanometers to 400 nanometers; and
    a VIS/IR-reflective metal layer disposed on at least a portion of the first major surface.

2. The broadband reflector of claim 1, further comprising an adhesive layer disposed on the metal layer opposite the UV-reflective multilayer optical film.

3. The broadband reflector of claim 1, wherein the VIS/IR-reflective metal layer comprises at least one of silver, copper, stainless steel, or aluminum.

4. The broadband reflector of claim 1, wherein at least one of the following conditions is met:
    the broadband reflector has an average light reflectivity of 90 percent over a wavelength range of 300 to 400 nanometers; or
    the broadband reflector has an average light reflectivity of at least 95 percent over a wavelength range of 350 to 2494 nanometers.

5. A concentrated solar power system comprising:
    at least one broadband reflector according to claim 1 capable of being aligned to direct solar radiation onto a hollow receiver; and
    a heat transfer fluid partially disposed within the hollow receiver.

6. The concentrated solar power system of claim 5, further comprising an electrical generator in fluid communication with the hollow receiver.

7. The concentrated solar power system of claim 5, further comprising a celestial tracking mechanism for the at least one broadband reflector.

8. The concentrated solar power system of claim 7,
    wherein the celestial tracking mechanism comprises a louver pivotally mounted adjacent the hollow receiver, wherein the louver comprises the at least one broadband reflector.

9. A method of harnessing solar energy, the method comprising reflecting solar radiation using at least one broadband reflector according to claim 1 onto a hollow receiver containing a heat transfer fluid to provide a heated heat transfer fluid.

10. A method of using the broadband reflector of claim 1, the method comprising:
    adhering the broadband reflector to an existing solar reflector adapted for use in a concentrated solar power system.

11. The broadband reflector of claim 1, wherein the UV-reflective multilayer optical film further comprises a tie layer that comprises the first major surface of the UV-reflective multilayer optical film.

12. The broadband reflector of claim 1, wherein the UV-reflective multilayer optical film further comprises a second major surface opposite the first major surface, and wherein the UV-reflective multilayer optical film further comprises an abrasion resistant layer that forms the second major surface of the UV-reflective multilayer optical film.

13. The broadband reflector of claim 1, wherein the UV-reflective multilayer optical film also reflects visible light.

14. A broadband reflector comprising:
    a UV-reflective multilayer optical film having a first major surface and comprising a UV-reflective optical layer stack, wherein the UV-reflective optical layer stack comprises first optical layers and second optical layers, wherein at least a portion of the first optical layers and at least a portion of the second optical layers are in intimate contact and have different refractive indexes; and
    a VIS/IR-reflective metal layer disposed on at least a portion of the first major surface, wherein:
    (i) the first optical layers comprise a syndiotactic polystyrene and the second optical layers comprise a polydiorganosiloxane polyoxamide block copolymer; or
    (ii) the first optical layers comprise a syndiotactic polystyrene and the second optical layers comprise a copolymer of tetrafluoroethylene, hexafluoropropylene, and vinylidene fluoride; or
    (iii) the first optical layers comprise a polymethyl methacrylate and the second optical layers comprise a copolymer of tetrafluoroethylene, hexafluoropropylene, and vinylidene fluoride; or
    (iv) the first optical layers comprise a copolymer of ethylene and a cyclic olefin and the second optical layers comprise a copolymer of tetrafluoroethylene, hexafluoropropylene, and vinylidene fluoride; or
    (iv) the first optical layers comprise a copolymer of ethylene and vinyl acetate and the second optical layers comprise a copolymer of tetrafluoroethylene, hexafluoropropylene, and vinylidene fluoride.

15. The broadband reflector of claim 14, wherein at least one of the following conditions is met:
    the broadband reflector has an average light reflectivity of 90 percent over a wavelength range of 300 to 400 nanometers; or
    the broadband reflector has an average light reflectivity of at least 95 percent over a wavelength range of 350 to 2494 nanometers.

16. The broadband reflector of claim 14, wherein the UV-reflective multilayer optical film further comprises a second major surface opposite the first major surface, and wherein the UV-reflective multilayer optical film further comprises an abrasion resistant layer that forms the second major surface of the UV-reflective multilayer optical film.

17. The broadband reflector of claim 14, wherein the UV-reflective multilayer optical film also reflects visible light.

18. A concentrated solar power system comprising:
    at least one broadband reflector according to claim 14 capable of being aligned to direct solar radiation onto a hollow receiver; and a heat transfer fluid partially disposed within the hollow receiver.

19. The broadband reflector of claim 14, further comprising an adhesive layer disposed on the metal layer opposite the UV-reflective multilayer optical film.

20. The broadband reflector of claim 14, wherein the VIS/IR-reflective metal layer comprises at least one of silver, copper, stainless steel, or aluminum.

* * * * *